(12) United States Patent
Ashida et al.

(10) Patent No.: US 11,431,071 B2
(45) Date of Patent: Aug. 30, 2022

(54) MULTILAYER BALUN

(71) Applicant: TDK CORPORATION, Tokyo (JP)

(72) Inventors: Yuta Ashida, Tokyo (JP); Masahiro Tatematsu, Tokyo (JP); Shuhei Sawaguchi, Tokyo (JP); Shigemitsu Tomaki, Tokyo (JP); Tetsuzo Goto, Tokyo (JP); Takeshi Kijima, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 17/160,559

(22) Filed: Jan. 28, 2021

(65) Prior Publication Data

US 2021/0242852 A1 Aug. 5, 2021

(30) Foreign Application Priority Data

Jan. 31, 2020 (JP) .............................. JP2020-014441

(51) Int. Cl.
| | |
|---|---|
| *H01P 5/10* | (2006.01) |
| *H03H 7/42* | (2006.01) |
| *H03H 7/09* | (2006.01) |
| *H01P 3/08* | (2006.01) |
| *H01G 4/30* | (2006.01) |
| *H03H 7/01* | (2006.01) |
| *H03H 1/00* | (2006.01) |

(52) U.S. Cl.
CPC ................ *H01P 5/10* (2013.01); *H01G 4/30* (2013.01); *H01P 3/082* (2013.01); *H03H 7/0115* (2013.01); *H03H 7/09* (2013.01); *H03H 7/42* (2013.01); *H03H 2001/0085* (2013.01)

(58) Field of Classification Search
CPC ............. H03H 2001/0085; H03H 7/09; H03H 7/0115; H01P 5/10; H01P 3/082
USPC ........................................ 333/175, 177, 185
See application file for complete search history.

(56) References Cited

U.S. PATENT DOCUMENTS

| | | | |
|---|---|---|---|
| 6,768,410 B1 * | 7/2004 | Yazaki | ...................... H01P 5/10 336/200 |
| 2001/0040495 A1 | 11/2001 | Morikawa | |
| 2019/0244741 A1 * | 8/2019 | Murakami | .............. H01F 27/29 |

FOREIGN PATENT DOCUMENTS

JP          2003-198221 A          7/2003

* cited by examiner

*Primary Examiner* — Rakesh B Patel
(74) *Attorney, Agent, or Firm* — Oliff PLC

(57) ABSTRACT

A balun includes first to fourth lines and a stack. A plurality of first conductor layers forming the first and third lines are located in a first region in the stack. A plurality of second conductor layers forming the second and fourth lines are located in a second region in the stack. A ground conductor layer is located closer to the second region than to the first region. The plurality of second conductor layers include a conductor layer pair where a distance between two conductor layers is smallest.

10 Claims, 21 Drawing Sheets

MULTILAYER BALUN

BACKGROUND OF THE INVENTION

1. Field of the Invention

The present invention relates to a multilayer balun capable of being used over a wide frequency band.

2. Description of the Related Art

One of electronic components for use in transmission/reception circuits of wireless communication apparatuses such as cellular phones and wireless LAN communication apparatuses is a balun for converting between an unbalanced signal and a balanced signal. It is required of the balun to exhibit a good amplitude balance characteristic and a good phase balance characteristic over a wide frequency band. The good amplitude balance characteristic means that two balanced element signals that constitute a balanced signal outputted from the balun have an amplitude difference of approximately zero. The good phase balance characteristic means that the two balanced element signals have a phase difference of approximately 180 degrees.

Examples of a mode of balun used in a wireless communication apparatus include multilayer baluns described in US 2001/0040495 A1 and JP 2003-198221 A. A multilayer balun is a balun formed by using a stack including a plurality of dielectric layers and a plurality of conductor layers stacked on each other. The multilayer baluns include an unbalanced transmission line, a first balanced transmission line electromagnetically coupled to a portion of the unbalanced transmission line, a second balanced transmission line electromagnetically coupled to another portion of the unbalanced transmission line, a ground conductor layer connected to a ground, and a stack. The unbalanced transmission line, the first balanced transmission line, the second balanced transmission line, and the ground conductor layer are formed of a plurality of conductor layers. The stack integrates the unbalanced transmission line, the first balanced transmission line, the second balanced transmission line, and the ground conductor layer.

Mobile communication systems up to the fourth generation are put to practical use at present. Standardization of fifth-generation mobile communication systems is now underway. One of the techniques enabling wide-band transmission in such mobile communication systems is carrier aggregation (hereinafter, also referred to as CA). CA uses multiple carriers called component carriers simultaneously to enable wideband transmission.

A mobile communication apparatus operable under CA uses multiple frequency bands simultaneously. Accordingly, such a mobile communication apparatus requires a balun operable in a wider band than was previously possible.

As described in US 2001/0040495 A1 and JP 2003-198221 A, multilayer baluns use a ground conductor layer as a shield. However, the conventional multilayer baluns are known to have difficulty in widening the use frequency band because of the ground conductor layer.

SUMMARY OF THE INVENTION

It is an object of the present invention to provide a multilayer balun capable of being used over a wide frequency band.

A multilayer balun according to the present invention includes an unbalanced port, a first balanced port, a second balanced port, a first line connected to the unbalanced port, a second line connected in series to the first line, a third line connected to the first balanced port and electromagnetically coupled to the first line, a fourth line connected to the second balanced port and electromagnetically coupled to the second line, and a stack for integrating the unbalanced port, the first and second balanced ports, and the first to fourth lines.

The stack includes a plurality of dielectric layers and a plurality of conductor layers stacked on each other. The plurality of conductor layers include a plurality of line-forming conductor layers and at least one ground conductor layer connected to a ground. The plurality of line-forming conductor layers include a plurality of first conductor layers forming the first and third lines and a plurality of second conductor layers forming the second and fourth lines, and includes a plurality of conductor layer pairs each including two conductor layers adjoining in a stacking direction of the plurality of dielectric layers and the plurality of conductor layers, the two conductor layers being electromagnetically coupled to each other.

The plurality of first conductor layers are located in a first region in the stack. The plurality of second conductor layers are located in a second region in the stack, the second region being located at a position different from the first region in the stacking direction. The at least one ground conductor layer is located at a position different from the first and second regions in the stacking direction and closer to the second region than to the first region. The plurality of second conductor layers include at least one conductor layer pair where a distance between the two conductor layers is smallest among the plurality of conductor layer pairs.

In the multilayer balun according to the present invention, the plurality of first conductor layers may include at least one conductor layer pair where the distance between the two conductor layers is largest among the plurality of conductor layer pairs.

In the multilayer balun according to the present invention, each of the first and third lines may include two or more of the plurality of first conductor layers. Each of the second and fourth lines may include two or more of the plurality of second conductor layers.

In the multilayer balun according to the present invention, the stack may include a top surface and a bottom surface located at opposite ends in the stacking direction. The second region may be located closer to the top surface of the stack than the first region is. In such a case, the at least one ground conductor layer may be located between the second region and the top surface of the stack.

The multilayer balun according to the present invention may further include a first path connecting the unbalanced port and the first line, and a first capacitor provided between the first path and the ground. In such a case, the plurality of conductor layers may further include a first capacitor-forming conductor layer forming the first capacitor.

The multilayer balun according to the present invention may further include a second path connecting the first balanced port and the third line, and a second capacitor provided between the second path and the ground. In such a case, the plurality of conductor layers may further include a second capacitor-forming conductor layer forming the second capacitor.

In the multilayer balun according to the present invention, the at least one ground conductor layer is located at a position different from the first and second regions in the stacking direction and closer to the second region than to the first region. The plurality of second conductor layers include at least one conductor layer pair where the distance between the two conductor layers is smallest among the plurality of conductor layer pairs. According to the present invention, a multilayer balun capable of being used over a wide frequency band can thus be constructed.

Other and further objects, features and advantages of the present invention will appear more fully from the following description.

DETAILED DESCRIPTION OF THE PREFERRED EMBODIMENTS

Figure 1:
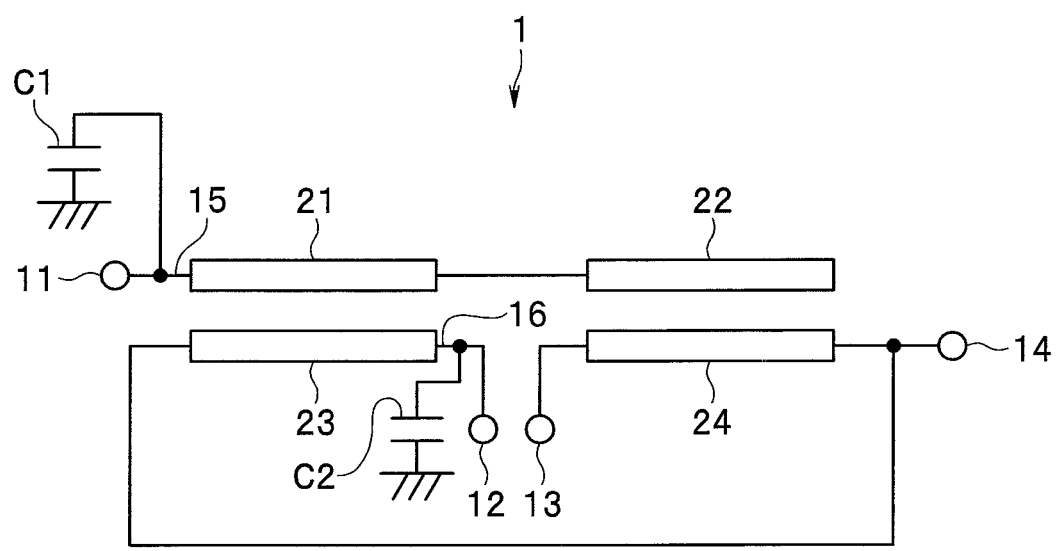
FIG. 1 is a circuit diagram showing the circuit configuration of a multilayer balun according to an embodiment of the invention.

An embodiment of the present invention will now be described in detail with reference to the drawings. First, reference is made to FIG. 1 to describe the circuit configuration of a multilayer balun (hereinafter simply referred to as balun) according to the embodiment of the invention. FIG. 1 shows the circuit configuration of the balun according to the embodiment. As shown in FIG. 1, a balun 1 includes an unbalanced port 11, a first balanced port 12, a second balanced port 13, a port 14, and first to fourth lines 21 to 24. The first line 21 is connected to the unbalanced port 11. The second line 22 is connected in series to the first line 21. The third line 23 is connected to the first balanced port 12. The fourth line 24 is connected to the second balanced port 13.

Each of the first to fourth lines 21 to 24 has a first end and a second end opposite to each other. The first end of the first line 21 is connected to the unbalanced port 11. The first end of the second line 22 is connected to the second end of the first line 21. The second end of the second line 22 is open. The first and second lines 21 and 22 constitute an unbalanced transmission line.

The first end of the third line 23 is connected to the first balanced port 12. The first end of the fourth line 24 is connected to the second balanced port 13. The second end of the third line 23 and the second end of the fourth line 24 are connected to the port 14. The port 14 is connected to a ground, for example.

The third and fourth lines 23 and 24 each constitute a balanced transmission line. The third line 23 is electromagnetically coupled to the first line 21. The fourth line 24 is electromagnetically coupled to the second line 22.

The balun 1 is a so-called merchant balun. Each of the first to fourth lines 21 to 24 is a quarter-wave line having a length of a quarter of a wavelength that corresponds to a predetermined frequency within the service frequency band of the balun 1.

The balun 1 further includes a first path 15, a second path 16, a first capacitor C1, and a second capacitor C2. The first path 15 connects the unbalanced port 11 and the first line 21. The second path 16 connects the first balanced port 12 and the third line 23. The first capacitor C1 is provided between the first path 15 and the ground. The second capacitor C2 is provided between the second path 16 and the ground.

The operation of the balun 1 will now be described. The balun 1 is configured so that an unbalanced signal is received at and outputted from the unbalanced port 11, a first balanced element signal is received at and outputted from the first balanced port 12, and a second balanced element signal is received at and outputted from the second balanced port 13. The first balanced element signal and the second balanced element signal constitute a balanced signal. The balun 1 converts between balanced and unbalanced signals.

Figure 2:
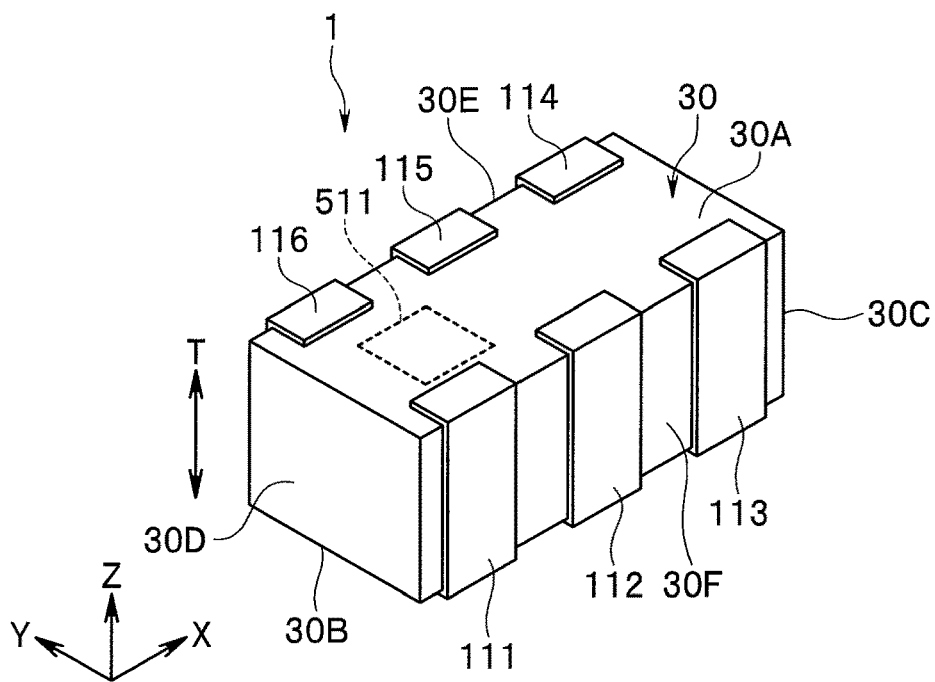
FIG. 2 is a perspective view showing the multilayer balun according to the embodiment of the invention.
Figure 3:
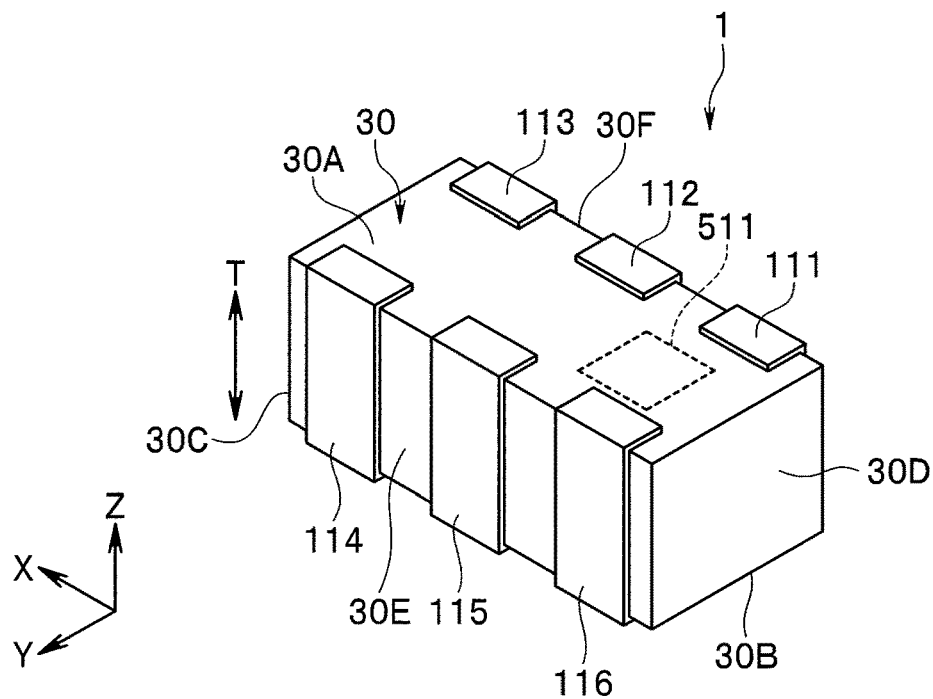
FIG. 3 is a perspective view showing the multilayer balun according to the embodiment of the invention.
Figure 4:
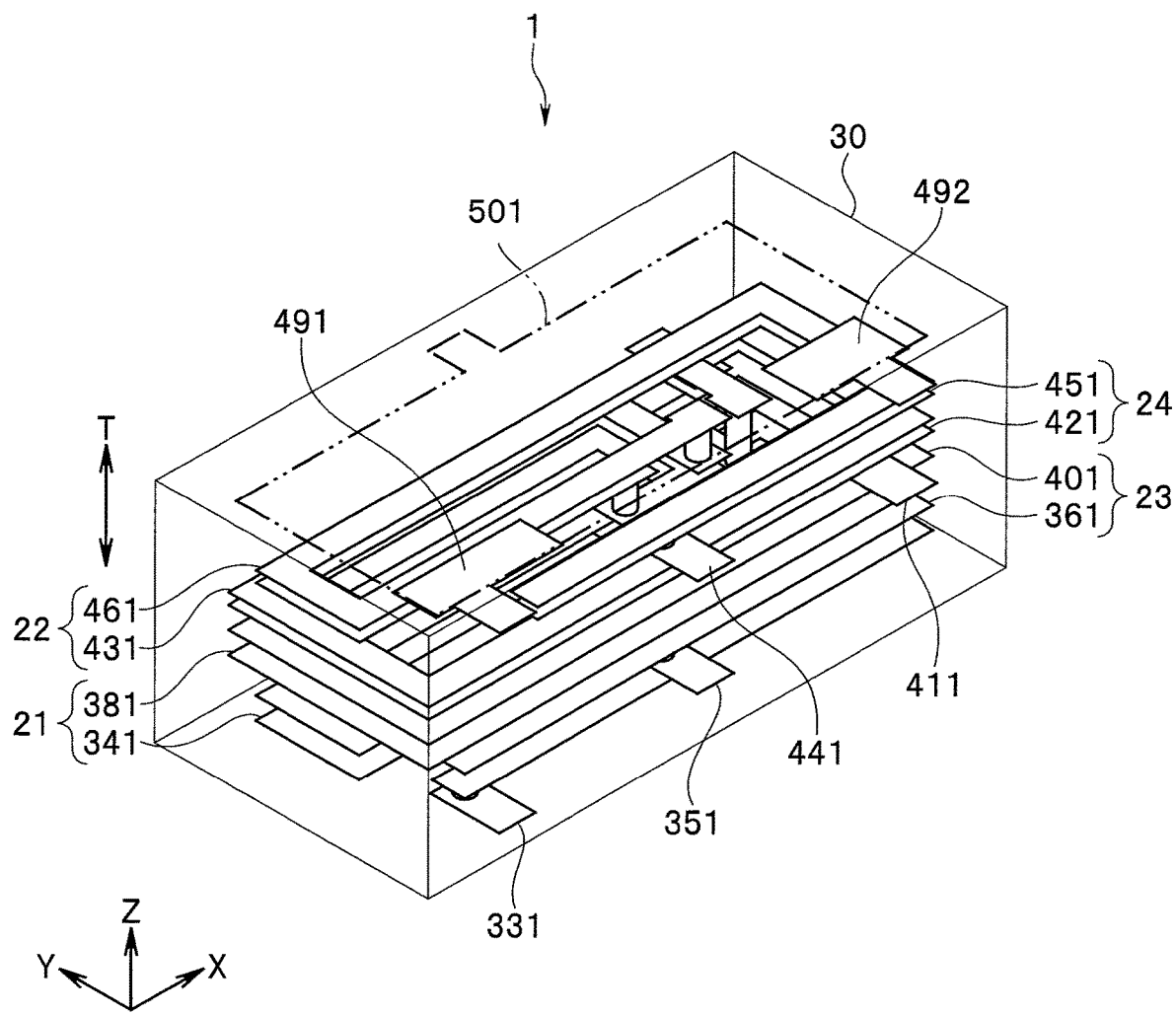
FIG. 4 is a perspective view showing the interior of the multilayer balun shown in FIG. 2 and FIG. 3.
Figure 5:
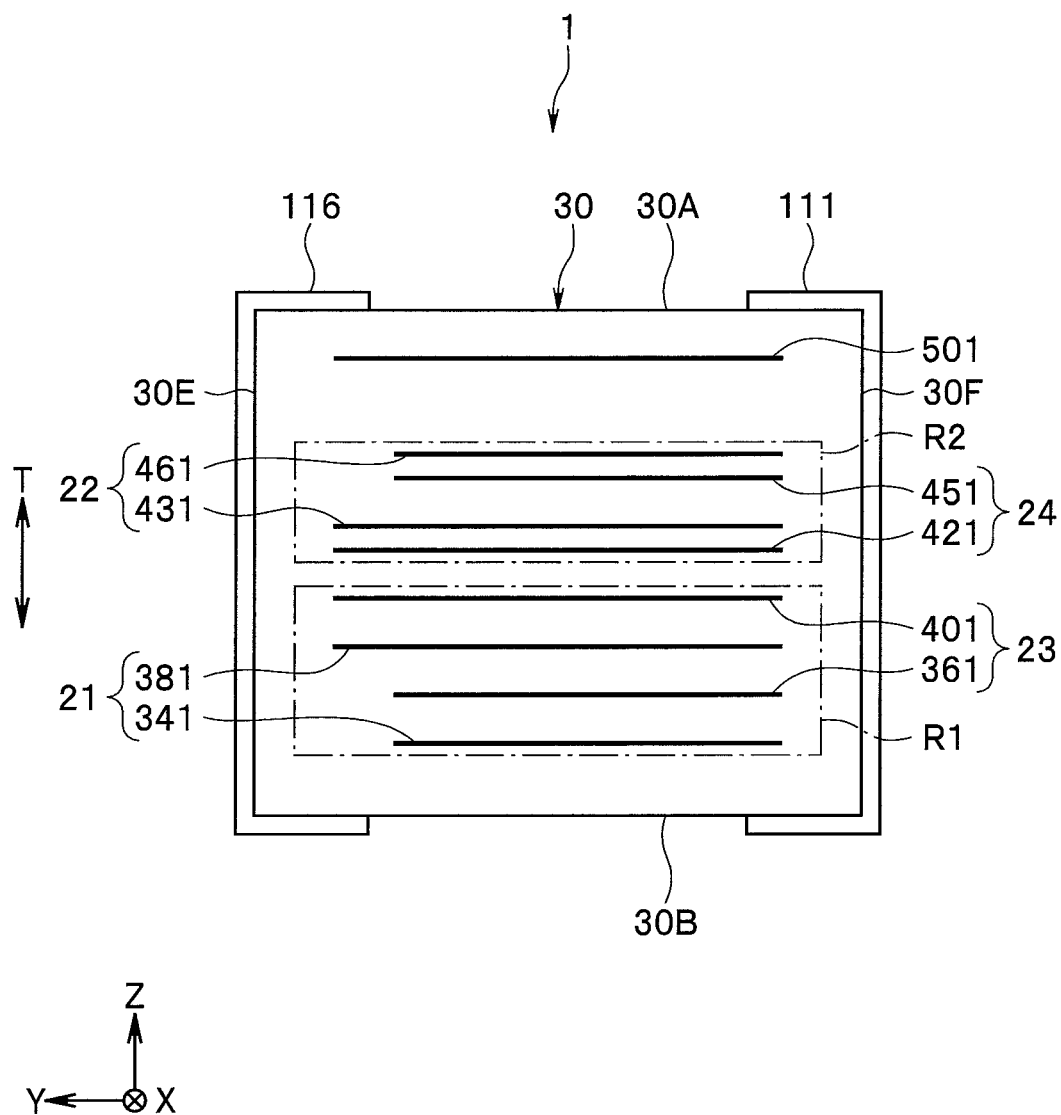
FIG. 5 is a side view showing the interior of the multilayer balun shown in FIG. 2 and FIG. 3.

Next, a structure of the balun 1 will be described with reference to FIGS. 2 to 5. FIGS. 2 and 3 are perspective views of the balun 1. FIG. 4 is a perspective view showing the interior of the balun 1. FIG. 5 is a side view showing the interior of the balun 1. The balun 1 further includes a stack 30 for integrating the ports 11 to 14, the first to fourth lines 21 to 24, and the first and second capacitors C1 and C2. As will be described in detail later, the stack 30 includes a plurality of dielectric layers and a plurality of conductor layers stacked on each other.

The stack 30 is shaped like a rectangular solid. The stack 30 includes a top surface 30A, a bottom surface 30B, and four side surfaces 30C to 30F, which constitute the periphery of the stack 30. The top surface 30A and the bottom surface 30B are opposite each other. The side surfaces 30C and 30D are opposite each other. The side surfaces 30E and 30F are opposite each other. The side surfaces 30C to 30F are perpendicular to the top surface 30A and the bottom surface 30B. In the stack 30, the plurality of dielectric layers and the plurality of conductor layers are stacked in the direction perpendicular to the top surface 30A and the bottom surface 30B. This direction will be referred to as the stacking direction. The stacking direction is shown by the arrow T in FIG. 2 to FIG. 5. The top surface 30A and the bottom surface 30B are located at opposite ends in the stacking direction T. FIG. 5 shows the balun 1 as seen from the side surface 30D side.

Here, X, Y, and Z directions are defined as shown in FIGS. 2 to 5. The X, Y, and Z directions are orthogonal to one another. In the present embodiment, a direction parallel to the stacking direction T will be referred to as the Z direction. In FIG. 5, the X direction is shown as a direction from the near side to the far side of FIG. 5. The Y direction is shown as a leftward direction. The Z direction is shown as an upward direction. The opposite directions to the X, Y, and Z directions are defined as −X, −Y, and −Z directions, respectively.

As shown in FIGS. 2 and 3, the top surface 30A is located at the end of the stack 30 in the Z direction. The bottom surface 30B is located at the end of the stack 30 in the −Z direction. The side surface 30C is located at the end of the stack 30 in the X direction. The side surface 30D is located at the end of the stack 30 in the −X direction. The side surface 30E is located at the end of the stack 30 in the Y direction. The side surface 30F is located at the end of the stack 30 in the −Y direction.

The balun 1 further includes first to sixth terminals 111, 112, 113, 114, 115, and 116. Each of the first to third terminals 111 to 113 is located to extend from the top surface 30A to the bottom surface 30B via the side surface 30F. The first to third terminals 111 to 113 are arranged in this order in the X direction. Each of the fourth to sixth terminals 114 to 116 is located to extend from the top surface 30A to the bottom surface 30B via the side surface 30E. The fourth to sixth terminals 114 to 116 are arranged in this order in the −X direction.

The first terminal 111 corresponds to the unbalanced port 11. The second terminal 112 corresponds to the port 14. The third terminal 113 corresponds to the first balanced port 12. The fourth terminal 114 corresponds to the second balanced port 13. The fifth terminal 115 is connected to the ground.

The stack 30 will be described in detail with reference to FIG. 6A to FIG. 15. The multilayer stack 30 includes twenty-one dielectric layers stacked on each other. The twenty-one dielectric layers will be referred to as the first to twenty-first dielectric layers in the order from bottom to top. The first to twenty-first dielectric layers will be denoted by the reference numerals 31 to 51.

Figure 6A:
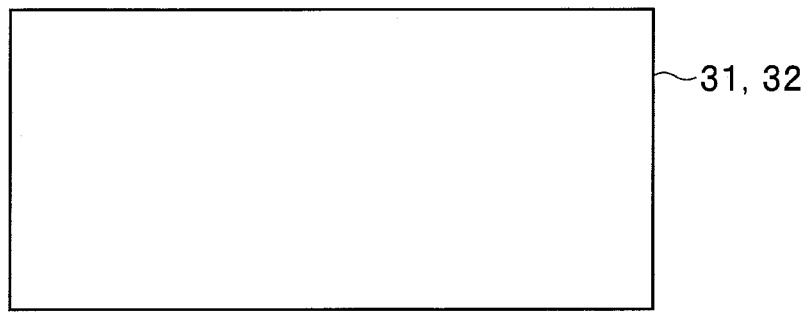
FIG. 6A is an explanatory diagram showing a patterned surface of each of a first and a second dielectric layer of the stack of the multilayer balun shown in FIG. 2 and FIG. 3.

FIG. 6A shows the patterned surface of each of the first dielectric layer 31 and the second dielectric layer 32. No conductor layers or through holes are formed on/in each of the dielectric layers 31 and 32.

Figure 6B:
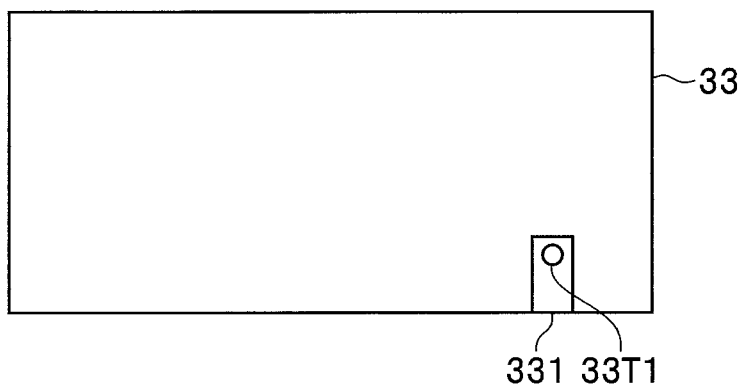
FIG. 6B is an explanatory diagram showing a patterned surface of a third dielectric layer of the stack of the multilayer balun shown in FIG. 2 and FIG. 3.

FIG. 6B shows the patterned surface of the third dielectric layer 33. A conductor layer 331 is formed on the patterned surface of the dielectric layer 33. The conductor layer 331 is connected to the first terminal 111 shown in FIG. 2 and FIG. 3. Further, a through hole 33T1 connected to the conductor layer 331 is formed in the dielectric layer 33.

Figure 7A:
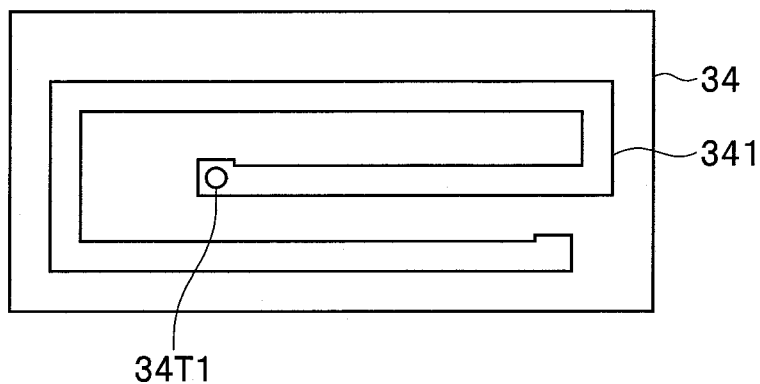
FIG. 7A and FIG. 7B are explanatory diagrams showing respective patterned surfaces of fourth and fifth dielectric layers of the stack of the multilayer balun shown in FIG. 2 and FIG. 3.

FIG. 7A shows the patterned surface of the fourth dielectric layer 34. A line-forming conductor layer 341 is formed on the patterned surface of the dielectric layer 34. The conductor layer 341 has a first end and a second end opposite to each other. The through hole 33T1 formed in the third dielectric layer 33 is connected to a portion of the conductor layer 341 near the first end thereof. Further, a through hole 34T1 is formed in the dielectric layer 52. The through hole 34T1 is connected to a portion of the conductor layer 341 near the second end thereof.

Figure 7B:
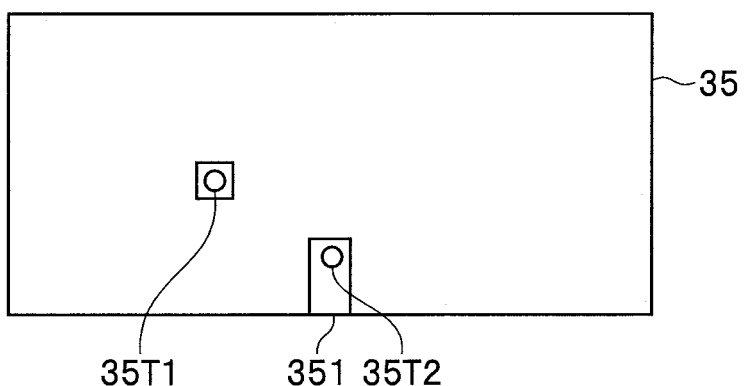

FIG. 7B shows the patterned surface of the fifth dielectric layer 35. A conductor layer 351 is formed on the patterned surface of the dielectric layer 35. The conductor layer 351 is connected to the second terminal 112 shown in FIG. 2 and FIG. 3. Further, through holes 35T1 and 35T2 are formed in the dielectric layer 35. The through hole 34T1 formed in the fourth dielectric layer 34 is connected to the through hole 35T1. The through hole 35T2 is connected to the conductor layer 351.

Figure 8A:
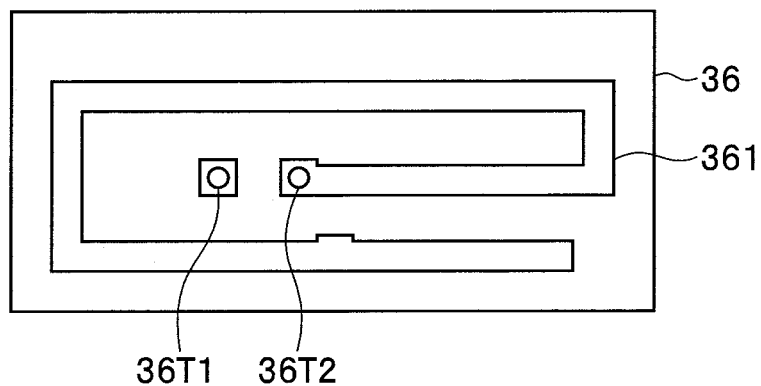
FIG. 8A and FIG. 8B are explanatory diagrams showing respective patterned surfaces of sixth and seventh dielectric layers of the stack of the multilayer balun shown in FIG. 2 and FIG. 3.

FIG. 8A shows the patterned surface of the sixth dielectric layer 36. A line-forming conductor layer 361 is formed on the patterned surface of the dielectric layer 36. The conductor layer 361 has a first end and a second end opposite to each other. The through hole 35T2 formed in the fifth dielectric layer 35 is connected to the conductor layer 361. The length of the conductor layer 361 from the connecting position between the conductor layer 361 and the through hole 35T2 to the first end of the conductor layer 361 is smaller than that of the conductor layer 361 from the connecting position to the second end of the conductor layer 361.

Further, through holes 36T1 and 36T2 are formed in the dielectric layer 36. The through hole 35T1 formed in the fifth dielectric layer 35 is connected to the through hole 36T1.

The through hole 36T2 is connected to a portion of the conductor layer 361 near the second end thereof.

Figure 8B:
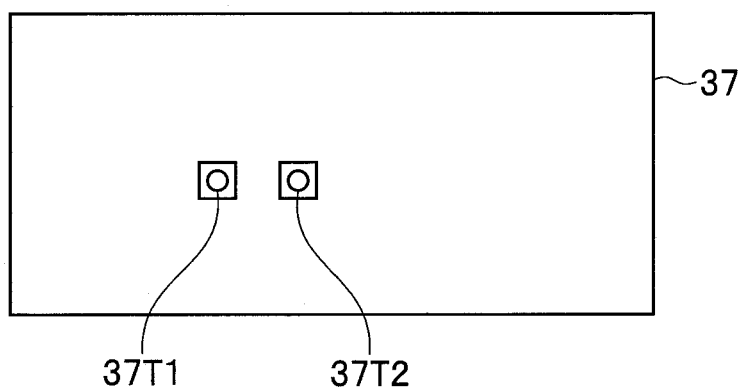

FIG. 8B shows the patterned surface of the seventh dielectric layer 37. Through holes 37T1 and 37T2 are formed in the dielectric layer 37. The through holes 36T1 and 36T2 formed in the sixth dielectric layer 36 are connected to the through holes 37T1 and 37T2, respectively.

Figure 9A:
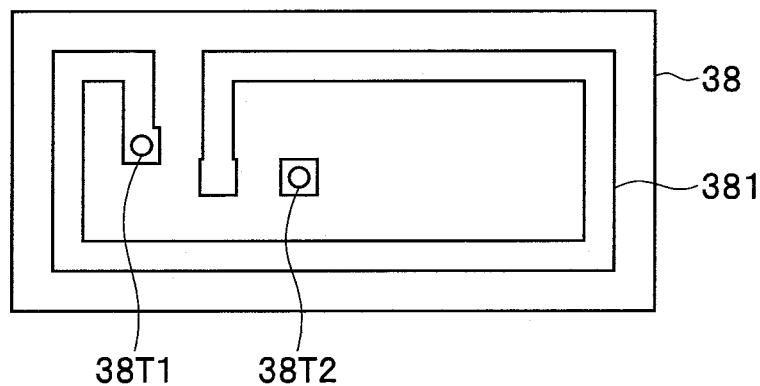
FIG. 9A and FIG. 9B are explanatory diagrams showing respective patterned surfaces of eighth and ninth dielectric layers of the stack of the multilayer balun shown in FIG. 2 and FIG. 3.

FIG. 9A shows the patterned surface of the eighth dielectric layer 38. A line-forming conductor layer 381 is formed on the patterned surface of the dielectric layer 38. The conductor layer 381 has a first end and a second end opposite to each other. The through hole 37T1 formed in the seventh dielectric layer 37 is connected to a portion of the conductor layer 381 near the first end thereof. Further, through holes 38T1 and 38T2 are formed in the dielectric layer 38. The through hole 38T1 is connected to a portion of the conductor layer 381 near the second end thereof. The through hole 37T2 formed in the dielectric layer 37 is connected to the through hole 38T2.

Figure 9B:
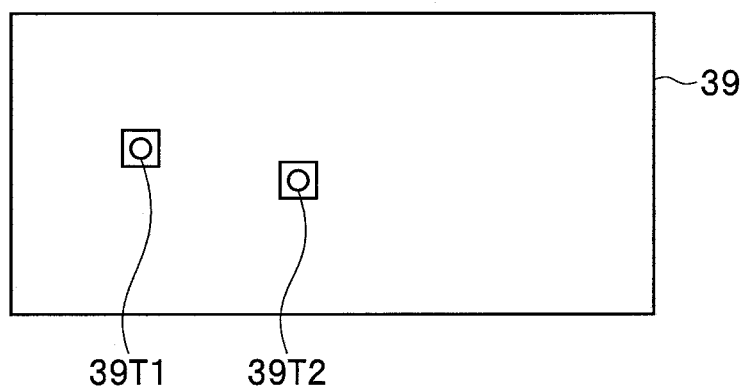

FIG. 9B shows the patterned surface of the ninth dielectric layer 39. Through holes 39T1 and 39T2 are formed in the dielectric layer 39. The through holes 38T1 and 38T2 formed in the eighth dielectric layer 38 are connected to the through holes 39T1 and 39T2, respectively.

Figure 10A:
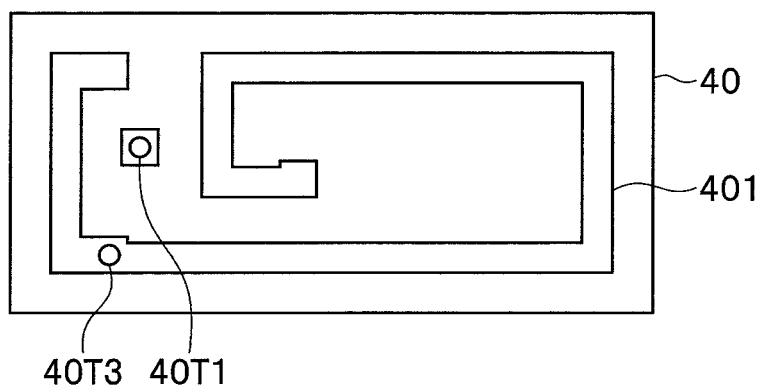
FIG. 10A and FIG. 10B are explanatory diagrams showing respective patterned surfaces of tenth and eleventh dielectric layers of the stack of the multilayer balun shown in FIG. 2 and FIG. 3.

FIG. 10A shows the patterned surface of the tenth dielectric layer 40. A line-forming conductor layer 401 is formed on the patterned surface of the dielectric layer 40. The conductor layer 401 has a first end and a second end opposite to each other. The through hole 39T2 formed in the ninth dielectric layer 39 is connected to a portion of the conductor layer 401 near the first end thereof.

Further, through holes 40T1 and 40T3 are formed in the dielectric layer 40. The through hole 39T1 formed in the ninth dielectric layer 39 is connected to the through hole 40T1. The through hole 39T3 is connected to the conductor layer 401. The length of the conductor layer 401 from the connecting position between the conductor layer 401 and the through hole 40T3 to the second end of the conductor layer 401 is smaller than that of the conductor layer 401 from the connecting position to the first end of the conductor layer 401.

Figure 10B:
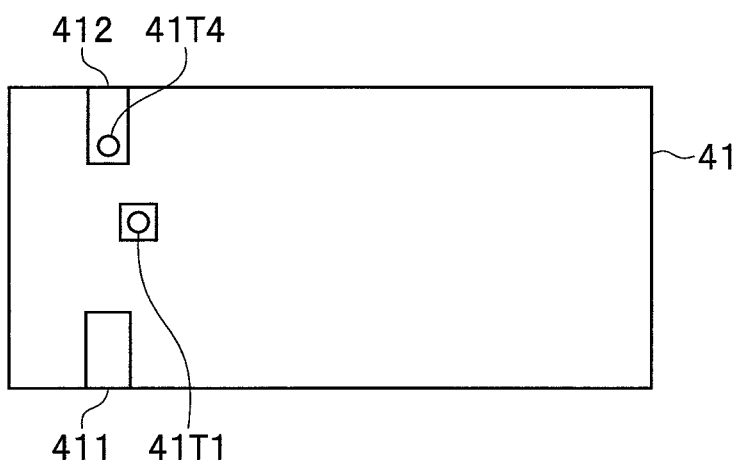

FIG. 10B shows the patterned surface of the eleventh dielectric layer 41. Conductor layers 411 and 412 are formed on the patterned surface of the dielectric layer 41. The through hole 40T3 formed in the tenth dielectric layer 40 is connected to the conductor layer 411. The conductor layer 441 is connected to the third terminal 113 shown in FIG. 2 and FIG. 3. The conductor layer 412 is connected to the fourth terminal 114 shown in FIG. 2 and FIG. 3.

Further, through holes 41T1 and 41T4 are formed in the dielectric layer 41. The through hole 40T1 formed in the tenth dielectric layer 40 is connected to the through hole 41T1. The through hole 41T4 is connected to the conductor layer 412.

Figure 11A:
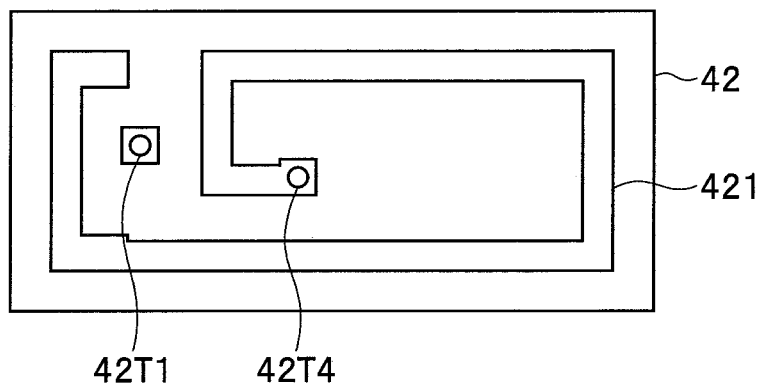
FIG. 11A and FIG. 11B are explanatory diagrams showing respective patterned surfaces of twelfth and thirteenth dielectric layers of the stack of the multilayer balun shown in FIG. 2 and FIG. 3.

FIG. 11A shows the patterned surface of the twelfth dielectric layer 42. A line-forming conductor layer 421 is formed on the patterned surface of the dielectric layer 42. The conductor layer 421 has a first end and a second end opposite to each other. The through hole 41T4 formed in the eleventh dielectric layer 41 is connected to a portion of the conductor layer 421 near the first end thereof. Further, through holes 42T1 and 42T4 are formed in the dielectric layer 42. The through hole 41T1 formed in the dielectric layer 41 is connected to the through hole 42T1. The through hole 41T4 is connected to a portion of the conductor layer 421 near the second end thereof.

Figure 11B:
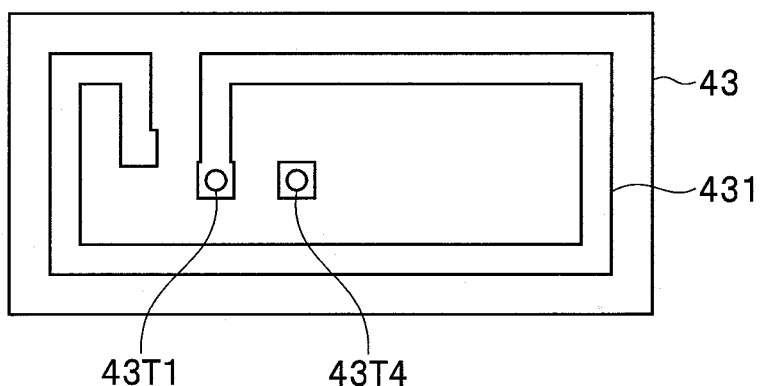

FIG. 11B shows the patterned surface of the thirteenth dielectric layer 43. A line-forming conductor layer 431 is formed on the patterned surface of the dielectric layer 43. The conductor layer 431 has a first end and a second end opposite to each other. The through hole 42T1 formed in the twelfth dielectric layer 42 is connected to a portion of the conductor layer 431 near the first end thereof. Further, through holes 43T1 and 43T4 are formed in the dielectric layer 43. The through hole 43T1 is connected to a portion of the conductor layer 431 near the second end thereof. The through hole 42T4 formed in the dielectric layer 42 is connected to the through hole 43T4.

Figure 12A:
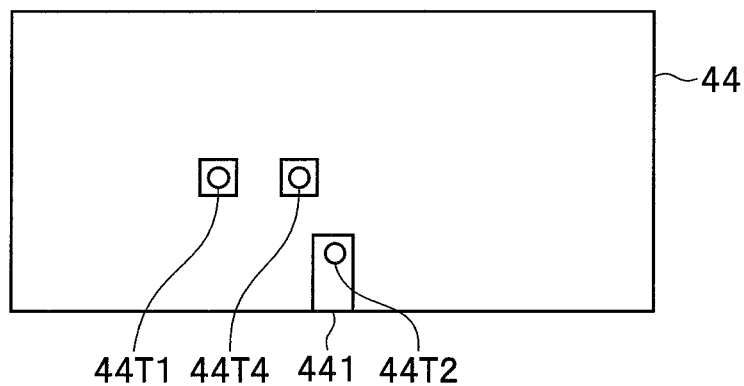
FIG. 12A and FIG. 12B are explanatory diagrams showing respective patterned surfaces of fourteenth and fifteenth dielectric layers of the stack of the multilayer balun shown in FIG. 2 and FIG. 3.

FIG. 12A shows the patterned surface of the fourteenth dielectric layer 44. A conductor layer 441 is formed on the patterned surface of the dielectric layer 44. The conductor layer 441 is connected to the second terminal 112 shown in FIG. 2 and FIG. 3. Further, through holes 44T1, 44T2, and 44T4 are formed in the dielectric layer 44. The through holes 43T1 and 43T4 formed in the thirteenth dielectric layer 43 are connected to the through holes 44T1 and 44T4, respectively. The through hole 44T2 is connected to the conductor layer 441.

Figure 12B:
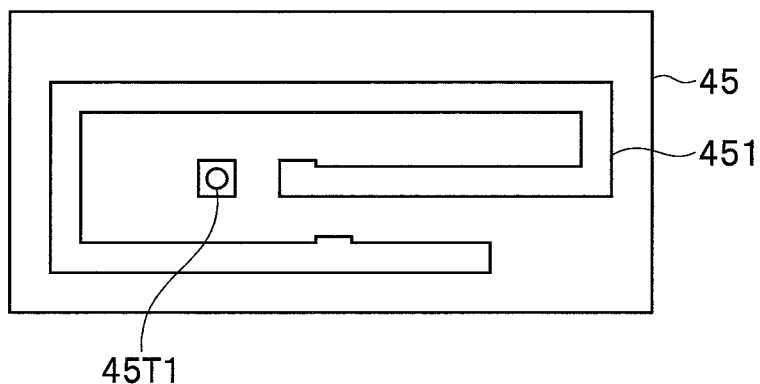

FIG. 12B shows the patterned surface of the fifteenth dielectric layer 45. A line-forming conductor layer 451 is formed on the patterned surface of the dielectric layer 45. The conductor layer 541 has a first end and a second end opposite to each other. The through holes 44T2 and 44T4 formed in the fourteenth dielectric layer 44 are connected to the conductor layer 451. The length of the conductor layer 451 from the connecting position between the conductor layer 451 and the through hole 44T2 to the first end of the conductor layer 451 is smaller than that of the conductor layer 451 from the connecting position to the second end of the conductor layer 451. The through hole 44T4 is connected to a portion of the conductor layer 451 near the second end thereof.

Further, through hole 45T1 is formed in the dielectric layer 45. The through hole 44T1 formed in the fourteenth dielectric layer 44 is connected to the through hole 45T1.

Figure 13A:
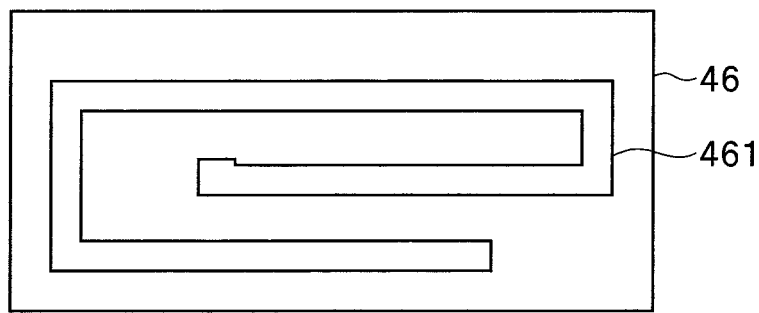
FIG. 13A is an explanatory diagram showing a patterned surface of a sixteenth dielectric layer of the stack of the multilayer balun shown in FIG. 2 and FIG. 3.

FIG. 13A shows the patterned surface of the sixteenth dielectric layer 46. A line-forming conductor layer 461 is formed on the patterned surface of the dielectric layer 46. The conductor layer 461 has a first end and a second end opposite to each other. The through hole 45T1 formed in the fifteenth dielectric layer 45 is connected to a portion of the conductor layer 461 near the first end thereof.

Figure 13B:
FIG. 13B is an explanatory diagram showing a patterned surface of each of a seventeenth and an eighteenth dielectric layer of the stack of the multilayer balun shown in FIG. 2 and FIG. 3.

FIG. 13B shows the patterned surface of each of the seventeenth dielectric layer 47 and the eighteenth dielectric layer 48. No conductor layers or through holes are formed on/in each of the dielectric layers 47 and 48.

Figure 14A:
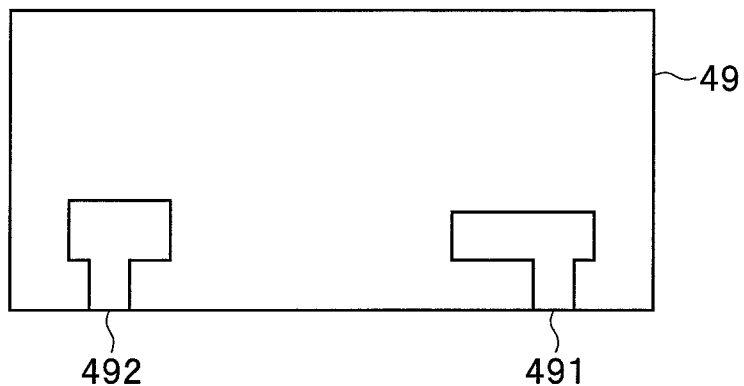
FIG. 14A and FIG. 14B are explanatory diagrams showing respective patterned surfaces of nineteenth and twentieth dielectric layers of the stack of the multilayer balun shown in FIG. 2 and FIG. 3.

FIG. 14A shows the patterned surface of the nineteenth dielectric layer 49. A first capacitor-forming conductor layer 491 and a second capacitor-forming conductor 492 are formed on the patterned surface of the dielectric layer 49. The conductor layer 491 is connected to the first terminal 111 shown in FIG. 2 and FIG. 3. The conductor layer 492 is connected to the third terminal 113 shown in FIG. 2 and FIG. 3.

Figure 14B:
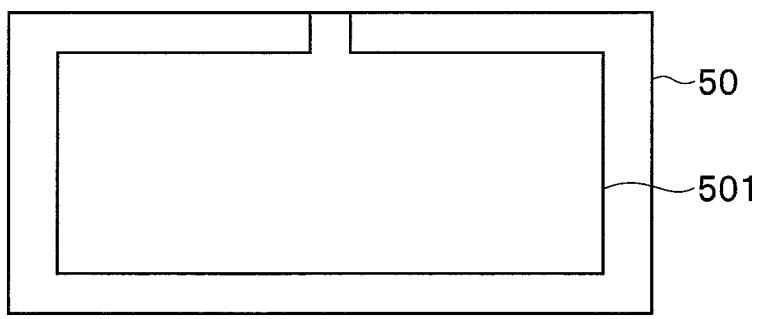

FIG. 14B shows the patterned surface of the twentieth dielectric layer 50. A ground conductor layer 501 is formed on the patterned surface of the dielectric layer 50. The conductor layer 501 is connected to the fifth terminal 115 shown in FIG. 2 and FIG. 3.

Figure 15:
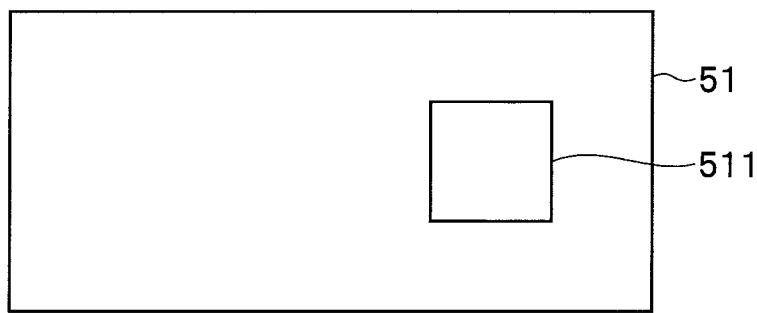
FIG. 15 is an explanatory diagram showing a patterned surface of a twenty-first dielectric layer of the stack of the multilayer balun shown in FIG. 2 and FIG. 3.

FIG. 15 shows the patterned surface of the twenty-first dielectric layer 51. A mark 511 is formed on the patterned surface of the dielectric layer 51.

The stack 30 shown in FIGS. 2 and 3 is formed by stacking the first to twenty-first dielectric layers 31 to 51 such that the patterned surface of the first dielectric layer 31 serves as the bottom surface 30B of the stack 30 and the surface of the twenty-first dielectric layer 51 opposite to the patterned surface thereof serves as the top surface 30A of the stack 30. The first to sixth terminals 111 to 116 are then formed on the periphery of the stack 30, whereby the balun 1 shown in FIGS. 2 and 3 is completed.

FIGS. 4 and 5 omit the mark 511. FIG. 5 omits the conductor layers 331, 351, 411, 412, 441, 491, and 492, part of the conductor layer 501, and all the through holes.

A correspondence between the components of the balun 1 and the components inside the stack 30 shown in FIGS. 6A to 15 will be described below. The plurality of conductor layers constituting the stack 30 include the plurality of line-forming conductor layers 341, 361, 381, 401, 421, 431, 451, and 461, and at least one ground conductor layer connected to the ground. In particular, in the present embodiment, the at least one ground conductor layer is the ground conductor layer 501.

The plurality of line-forming conductor layers 341, 361, 381, 401, 421, 431, 451, and 461 include a plurality of first conductor layers forming the first and third lines 21 and 23, and a plurality of second conductor layers forming the second and fourth lines 22 and 24. In the present embodiment, the conductor layers 341, 361, 381, and 401 correspond to the first conductor layers. The conductor layers 421, 431, 451, and 461 correspond to the second conductor layers. Hereinafter, the conductor layers 341, 361, 381, and 401 will be referred to also as first conductor layers 341, 361, 381, and 401. The conductor layers 421, 431, 451, and 461 will be referred to also as second conductor layers 421, 431, 451, and 461.

The first line 21 is formed of the first conductor layers 341 and 381. The portion of the conductor layer 341 near the first end thereof is connected to the first terminal 111 via the conductor layer 331 and the through hole 33T1. The portion of the conductor layer 381 near the first end thereof is connected to the portion of the conductor layer 341 near the second end thereof via the through holes 34T1, 35T1, 36T1, and 37T1.

The second line 22 is formed of the second conductor layers 431 and 461. A portion of the conductor layer 431 near the first end thereof is connected to the portion of the conductor layer 381 near the second end thereof, which constitutes the first line 21, via the through holes 38T1, 39T1, 40T1, 41T1, and 42T1. The portion of the conductor layer 461 near the first end thereof is connected to the portion of the conductor layer 431 near the second end thereof via the through holes 43T1, 44T1, and 45T1.

The third line 23 is formed of the first conductor layers 361 and 401. The conductor layer 401 is connected to the third terminal 113 via the through hole 40T3 and the conductor layer 411. The portion of the conductor layer 361 near the second end thereof is connected to the portion of the conductor layer 401 near the first end thereof via the through holes 36T2, 37T2, 38T2, and 39T2. The conductor layer 361 is connected to the second terminal 112 via the conductor layer 351 and the through hole 35T2.

The fourth line 24 is formed of the second conductor layers 421 and 451. The portion of the conductor layer 421 near the first end thereof is connected to the fourth terminal 114 via the conductor layer 412 and the through hole 41T4. The portion of the conductor layer 451 near the second end thereof is connected to the portion of the conductor layer 421 near the second end thereof via the through holes 42T4, 43T4, and 44T4. The conductor layer 451 is connected to the second terminal 112 via the conductor layer 441 and the through hole 44T2.

The first capacitor C1 is formed of the second capacitor-forming conductor layer 491, the ground conductor layer 501, and the dielectric layer 49 interposed between the conductor layers 491 and 501. The conductor layer 491 is connected to the first terminal 111.

The second capacitor C2 is formed of the second capacitor-forming conductor layer 492, the ground conductor layer 501, and the dielectric layer 49 interposed between the conductor layers 492 and 501. The conductor layer 492 is connected to the third terminal 113.

Next, structural features of the balun 1 will be described with reference to FIG. 5. The first conductor layers 341, 361, 381, and 401 forming the first and third lines 21 and 23 are located in a first region R1 in the stack 30. The second conductor layers 421, 431, 451, and 461 forming the second and fourth lines 22 and 24 are located in a second region R2 in the stack 30. FIG. 5 shows the first region R1 and the second region R2. As shown in FIG. 5, the second region R2 is located at a position different from the first region R1 in the stacking direction T. In particular, in the present embodiment, the second region R2 is located closer to the top surface 30A of the stack 30 than the first region R1 is.

The ground conductor layer 501 is located at a position different from the first and second regions R1 and R2 in the stacking direction T and closer to the second region R2 than to the first region R1. More specifically, the ground conductor layer 501 is located at a position closer to the plurality of second conductor layers 421, 431, 451, and 461 located in the second region R2 than to the plurality of first conductor layers 341, 361, 381, and 401 located in the first region R1. Of the plurality of first conductor layers 341, 361, 381, and 401, the conductor layer 401 is the closest to the ground conductor layer 501. Of the plurality of second conductor layers 421, 431, 451, and 461, the conductor layer 461 is the closest to the ground conductor layer 501. The distance between the ground conductor layer 501 and the conductor layer 461 is smaller than that between the ground conductor layer 501 and the conductor layer 401.

In particular, in the present embodiment, the ground conductor layer 501 is located between the second region R2 and the top surface 30A of the stack 30. The ground conductor layer 501 functions as a shield.

The plurality of line-forming conductor layers 341, 361, 381, 401, 421, 431, 451, and 461 include a plurality of conductor layer pairs each including two conductor layers that adjoin in the stacking direction T and are electromagnetically coupled to each other. In the present embodiment, a pair of conductor layers 341 and 361, a pair of conductor layers 381 and 401, a pair of conductor layers 421 and 431, and a pair of conductor layers 451 and 461 correspond to the conductor layer pairs.

The plurality of second conductor layers 421, 431, 451, and 461 include at least one conductor layer pair where the distance between the two conductor layers is smallest among the plurality of conductor layer pairs. The plurality of first conductor layers 341, 361, 381, and 401 include at least one conductor layer pair where the distance between the two conductor layers is largest among the plurality of conductor layer pairs.

In the present embodiment, the distance between the conductor layers 341 and 361 and the distance between the conductor layers 381 and 401 are equal to each other. The distance between the conductor layers 421 and 431 and the distance between the conductor layers 451 and 461 are equal to each other. The distance between the conductor layers 341 and 361 may be slightly different from that between the conductor layers 381 and 401 because of factors such as the manufacturing accuracy of the balun 1. Similarly, the distance between the conductor layers 421 and 431 may be slightly different from that between the conductor layers 451 and 461.

The distance between the conductor layers 341 and 361 and the distance between the conductor layers 381 and 401 will now be denoted by the symbol D1. The distance between the conductor layers 421 and 431 and the distance between the conductor layers 451 and 461 will be denoted by the symbol D2. The distance D2 is smaller than the distance D1. The pair of conductor layers 421 and 431 and the pair of conductor layers 451 and 461 correspond to the at least one conductor layer pair where the distance between the two conductor layers is smallest. The pair of conductor layers 341 and 361 and the pair of conductor layers 381 and 401 correspond to the at least one conductor layer pair where the distance between the two conductor layers is largest.

As described above, in the balun 1 according to the present embodiment, the plurality of line-forming conductor layers 341, 361, 381, 401, 421, 431, 451, and 461 and the ground conductor layer 501 are located to satisfy the foregoing structural features of the balun 1. According to the present embodiment, the balun 1 can thus be used over a wide frequency band. This effect will be described in detail later with reference to simulation results.

Next, examples of characteristics of the balun 1 according to the present embodiment will be described with reference to FIGS. 16 to 19. The following examples of the characteristics of the balun 1 deal with a case where the balanced lines connected to the first and second balanced ports 12 and 13 are designed to have an impedance of 50Ω and the use frequency band of the balun 1 is designed to include a frequency band of 2.2 to 3.9 GHz.

Figure 16:
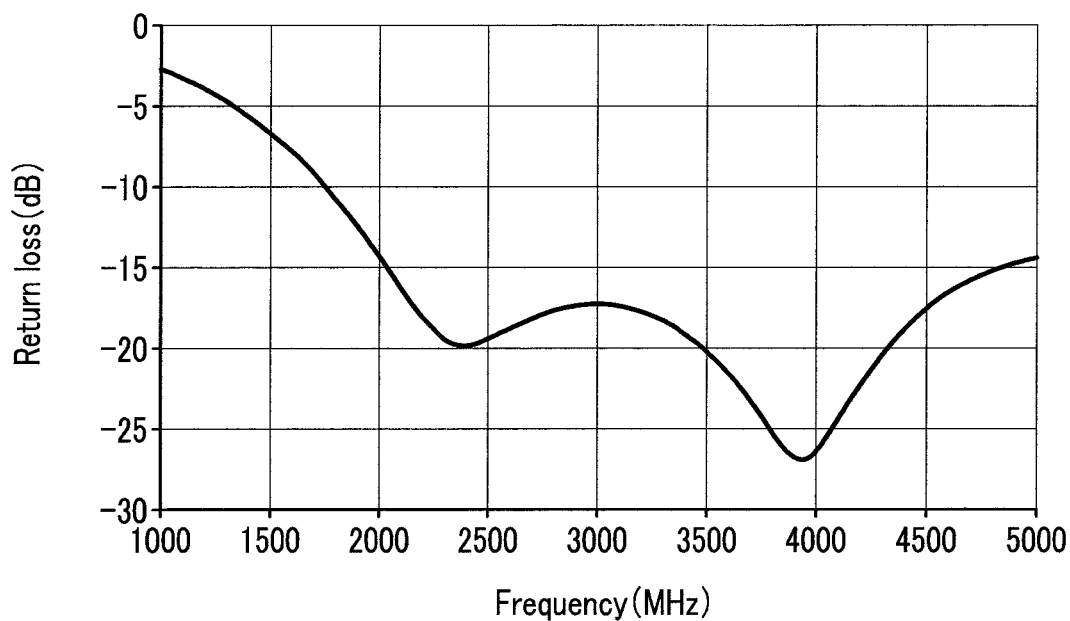
FIG. 16 is a characteristic diagram showing an example of reflection characteristic of the multilayer balun according to the embodiment of the invention.

FIG. 16 shows an example of the reflection characteristic of the balun 1. The reflection characteristic of the balun 1 is represented here using a single-ended S-parameter representing the response of a signal outputted from the unbalanced port 11 upon input of an unbalanced signal to the unbalanced port 11. This S-parameter will hereinafter be referred to as return loss. In FIG. 16, the horizontal axis represents frequency, and the vertical axis represents return loss. With the return loss denoted as −r (dB), r preferably has a value of 10 or more. As shown in FIG. 16, the balun 1 has an r value of 10 or more in the foregoing frequency band.

Figure 17:
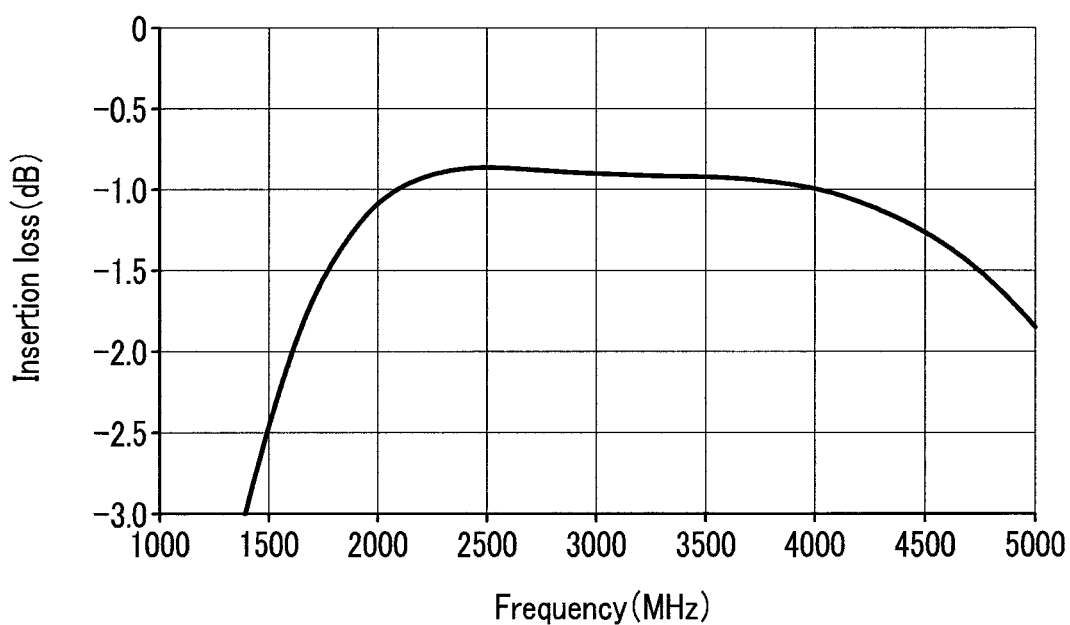
FIG. 17 is a characteristic diagram showing an example of pass characteristic of the multilayer balun according to the embodiment of the invention.

FIG. 17 shows an example of the pass characteristic of the baluns 1. The pass characteristic of the balun 1 is represented here using a mixed-mode S-parameter representing the response of a difference signal of first and second balanced element signals outputted from the first and second balanced ports 12 and 13 upon input of an unbalanced signal to the unbalanced port 11. This S-parameter will hereinafter be referred to as insertion loss. In FIG. 17, the horizontal axis represents frequency, and the vertical axis represents insertion loss. With the insertion loss denoted as −i (dB), i preferably has a value of 1.5 or less, and more preferably 1.0 or less. As shown in FIG. 17, the balun 1 has an i value of 1.0 or less in the foregoing frequency band.

Figure 18:
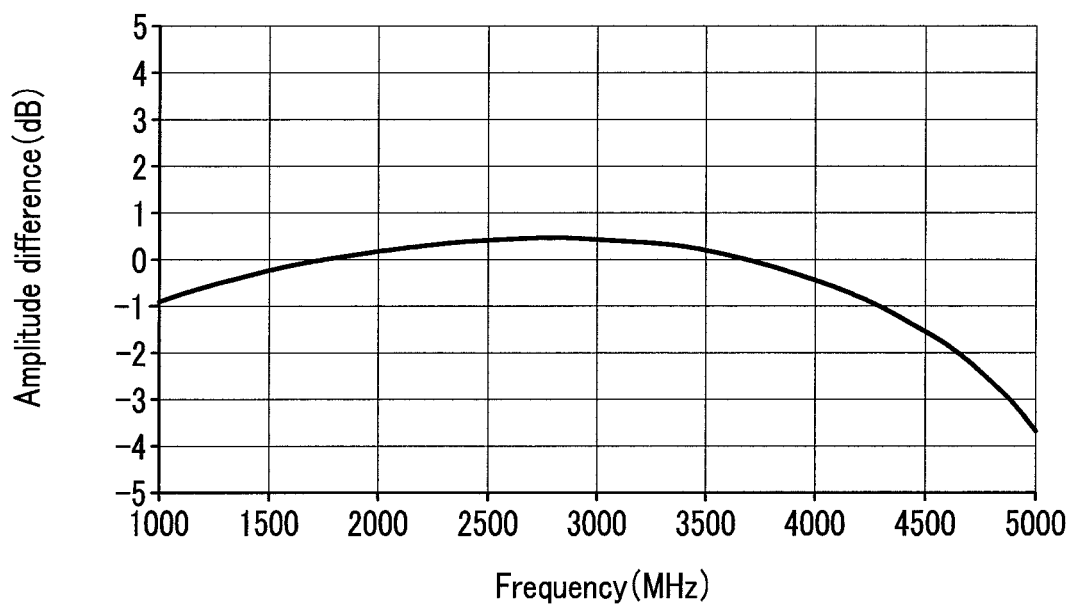
FIG. 18 is a characteristic diagram showing an example of amplitude balance characteristic of the multilayer balun according to the embodiment of the invention.

FIG. 18 shows an example of amplitude balance characteristic of the balun 1. The amplitude balance characteristic of the balun 1 is represented here using a difference in amplitude between the first and second balanced element signals outputted from the first and second balanced ports 12 and 13 upon input of an unbalanced signal to the unbalanced port 11, which will hereinafter be simply referred to as the amplitude difference. The amplitude difference is expressed in positive values when the amplitude of the first balanced element signal is greater than the amplitude of the second balanced element signal, and in negative values when the amplitude of the first balanced element signal is smaller than the amplitude of the second balanced element signal. In FIG. 18, the horizontal axis represents frequency, and the vertical axis represents amplitude difference. With the amplitude difference denoted as m (dB), m preferably has a value of −1.5 or more and not more than 1.5, and more preferably −1.0 or more and not more than 1.0. As shown in FIG. 18, the balun 1 has an m value of −1.0 or more and not more than 1.0 in the foregoing frequency band.

Figure 19:
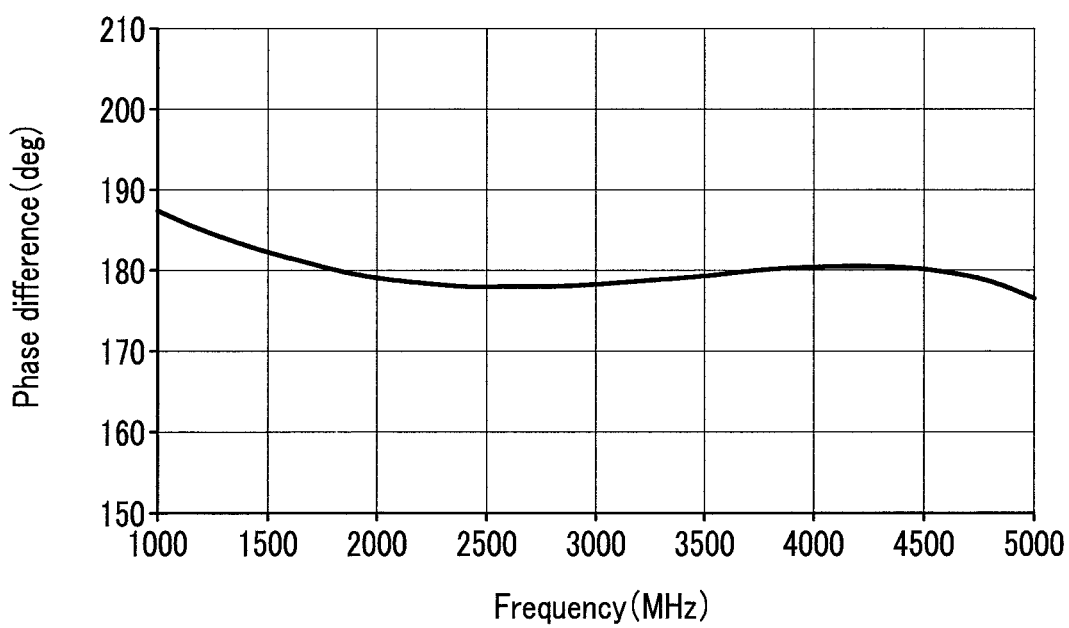
FIG. 19 is a characteristic diagram showing an example of phase balance characteristic of the multilayer balun according to the embodiment of the invention.

FIG. 19 shows an example of phase balance characteristic of the balun 1. The phase balance characteristic of the balun 1 is represented here using a difference in phase between the first and second balanced element signals outputted from the first and second balanced ports 12 and 13 upon input of an unbalanced signal to the unbalanced port 11, which will hereinafter be simply referred to as the phase difference. The phase difference represents the magnitude of advancement of the phase of the first balanced element signal relative to the phase of the second balanced element signal. In FIG. 19, the horizontal axis represents frequency, and the vertical axis represents phase difference. With the phase difference denoted as p (deg), p preferably has a value of 170 or more and not more than 190. As shown in FIG. 19, the balun 1 has a p value of 170 or more and not more than 190 in the foregoing frequency band.

As described above, the balun 1 having the characteristics shown in FIGS. 16 to 19 can be used over a wide frequency band of at least 2.2 to 3.9 GHz.

Next, the results of a simulation examining a relationship between the structural features of the balun 1 and the characteristics of the balun 1 will be described. In the simulation, even impedance $Z_e$ was used as a parameter having a correspondence with the position of the ground conductor layer 501. In the simulation, odd impedance $Z_o$ was used as a parameter having a correspondence with the distance between two conductor layers constituting a conductor layer pair.

Now, take two parallel lines. Assume that the capacitance between the two lines is $C_{12}$, and the capacitance between each of the two lines and the ground per 1 m is $C_{11}$. The even impedance $Z_e$ is expressed by the following Eq. (1):

$$Z_e = \sqrt{(\varepsilon_r)}/(v_0 * C_{11}), \qquad (1)$$

where $v_0$ is the speed of light, and $\varepsilon_r$ is relative permittivity.

The odd impedance $Z_o$ is expressed by the following Eq. (2):

$$Z_o = \sqrt{(\varepsilon_r)}/(v_0 *(C_{11}+2C_{12})). \qquad (2)$$

The balun has $C_{12}$ sufficiently higher than $C_{11}$. If $C_{12}$ is sufficiently higher than $C_{11}$, the odd impedance $Z_o$ can be expressed by the following approximation (3):

$$Z_o \approx \sqrt{(\varepsilon_r)}/(v_0 *(2C_{12})). \qquad (3)$$

The greater the distances between the two lines and the ground, the lower the capacitance $C_{11}$. From Eq. (1), the greater the distances between the two lines and the ground, the higher the even impedance $Z_e$. The even impedance $Z_e$ thus has a correspondence with the distances between the two lines and the ground.

Meanwhile, the greater the distance between the two lines, the lower the capacitance $C_{12}$. From Eq. (3), the greater the distance between the two lines, the higher the odd impedance $Z_o$. The odd impedance $Z_o$ thus has a correspondence with the distance between the two lines.

For the simulation, first to fourth models of the balun 1 according to the present embodiment were made. In the first to fourth models, the pair of first and third lines 21 and 23 and the pair of second and fourth lines 22 and 24 had respective different even and odd impedances $Z_e$ and $Z_o$. The reflection characteristic, pass characteristic, amplitude balance characteristic, and phase balance characteristic of each of the first to fourth models were then determined. The first to fourth models were designed so that the balanced lines connected to the first and second balanced ports 12 and 13 had an impedance of 50Ω.

The even impedance $Z_e$ and odd impedance $Z_o$ of the pair of first and third lines 21 and 23 will be denoted by the symbols $Z_{e1}$ and $Z_{o1}$, respectively. The even impedance $Z_e$ and odd impedance $Z_o$ of the pair of second and fourth lines 22 and 24 will be denoted by the symbols $Z_{e2}$ and $Z_{o2}$, respectively. In the first model, $Z_{e1}$ was 400Ω, $Z_{e2}$ was 200Ω, $Z_{o1}$ was 24Ω, and $Z_{o2}$ was 10Ω. In the second model, $Z_{e1}$ was 200Ω, $Z_{e2}$ was 400Ω, $Z_{o1}$ was 24Ω, and $Z_{o2}$ was 10Ω. In the third model, $Z_{e1}$ was 400Ω, $Z_{e2}$ was 200Ω, $Z_{o1}$ was 10Ω, and $Z_{o2}$ was 24Ω. In the fourth model, $Z_{e1}$ was 200Ω, $Z_{e2}$ was 400Ω, $Z_{o1}$ was 10Ω, and $Z_{o2}$ was 24Ω.

Figure 20:
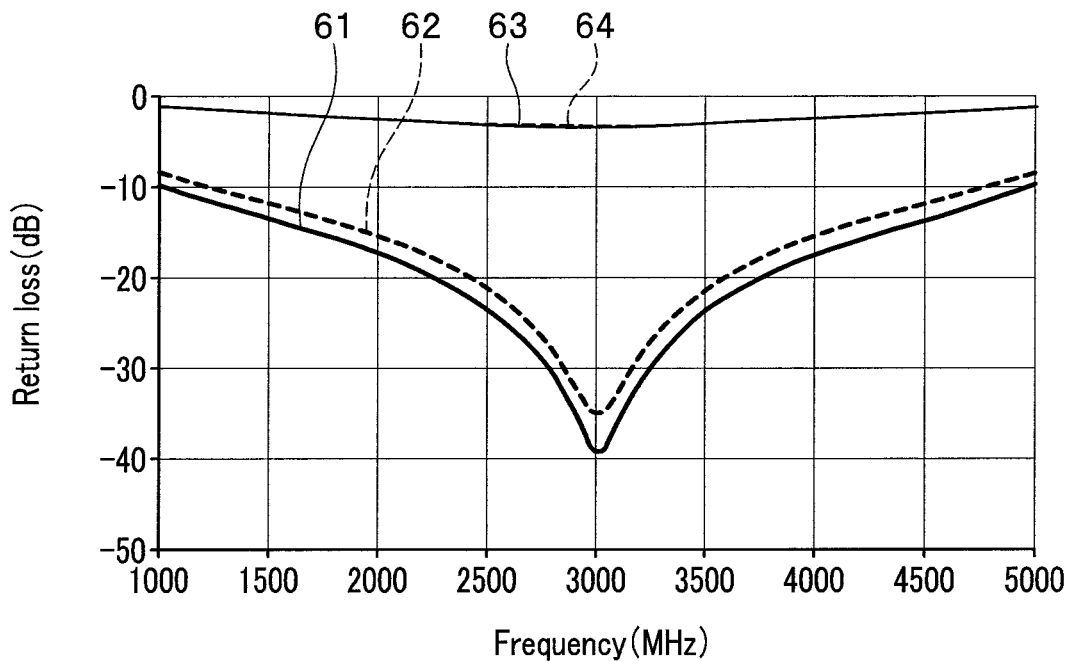
FIG. 20 is a characteristic diagram showing the reflection characteristics of first to fourth models determined by a simulation.

FIG. 20 shows the reflection characteristics of the first to fourth models. Like FIG. 16, FIG. 20 shows the reflection characteristics of the first to fourth models in terms of return loss. In FIG. 20, the horizontal axis represents frequency, and the vertical axis the return loss. In FIG. 20, the reference numeral 61 denotes the return loss of the first model, the reference numeral 62 the return loss of the second model, the reference numeral 63 the return loss of the third model, and the reference numeral 64 the return loss of the fourth model. As shown in FIG. 20, with the return loss denoted as −r (dB), the first and second models had large r values and the third and fourth models small r values over a wide frequency band of 2.2 to 3.9 GHz, for example. In view of increasing the r value, the first and second models are preferable to the third and fourth models.

Figure 21:
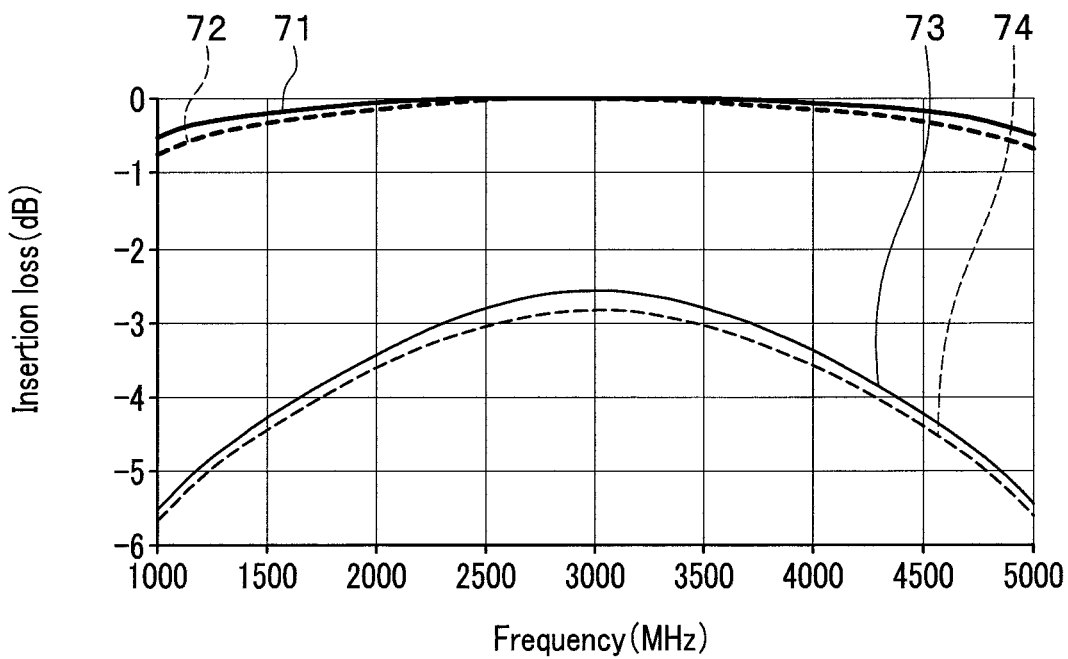
FIG. 21 is a characteristic diagram showing the pass characteristics of first to fourth models determined by a simulation.

FIG. 21 shows the pass characteristics of the first to fourth models. Like FIG. 17, FIG. 21 shows the pass characteristics of the first to fourth models in terms of insertion loss. In FIG. 21, the horizontal axis represents frequency, and the vertical axis the insertion loss. In FIG. 21, the reference numeral 71 denotes the insertion loss of the first model, the reference numeral 72 the insertion loss of the second model, the reference numeral 73 the insertion loss of the third model, and the reference numeral 74 the insertion loss of the fourth model. As shown in FIG. 21, with the insertion loss denoted as −i (dB), the first and second models had small i values and the third and fourth models large i values over a wide frequency band of 2.2 to 3.9 GHz, for example. In view of reducing the i value, the first and second models are preferable to the third and fourth models.

Figure 22:
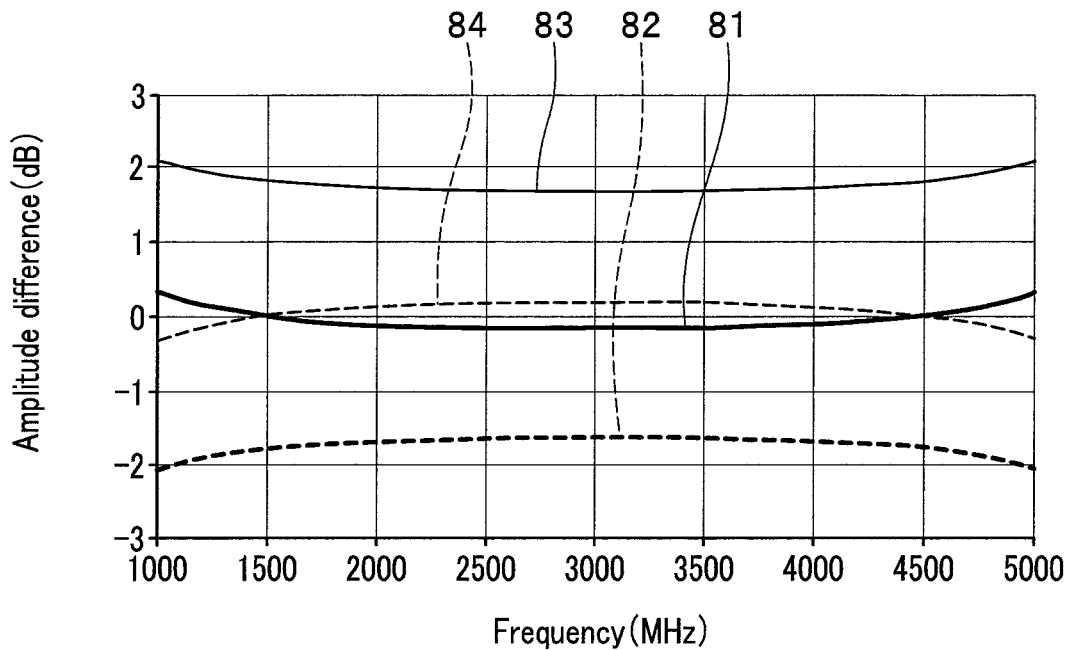
FIG. 22 is a characteristic diagram showing the amplitude balance characteristics of first to fourth models determined by a simulation.

FIG. 22 shows the amplitude balance characteristics of the first to fourth models. Like FIG. 18, FIG. 22 shows the amplitude balance characteristics of the first to fourth models in terms of amplitude difference. In FIG. 22, the reference numeral 81 denotes the amplitude difference of the first model, the reference numeral 82 the amplitude difference of the second model, the reference numeral 83 the amplitude difference of the third model, and the reference numeral 84 the amplitude difference of the fourth model. With the amplitude difference denoted as m (dB), the first and fourth models had m of small absolute values and the second and third models m of large absolute values over a wide frequency band of 2.2 to 3.9 GHz, for example. In view of reducing the absolute value of m, the first and fourth models are preferable to the second and third models.

Figure 23:
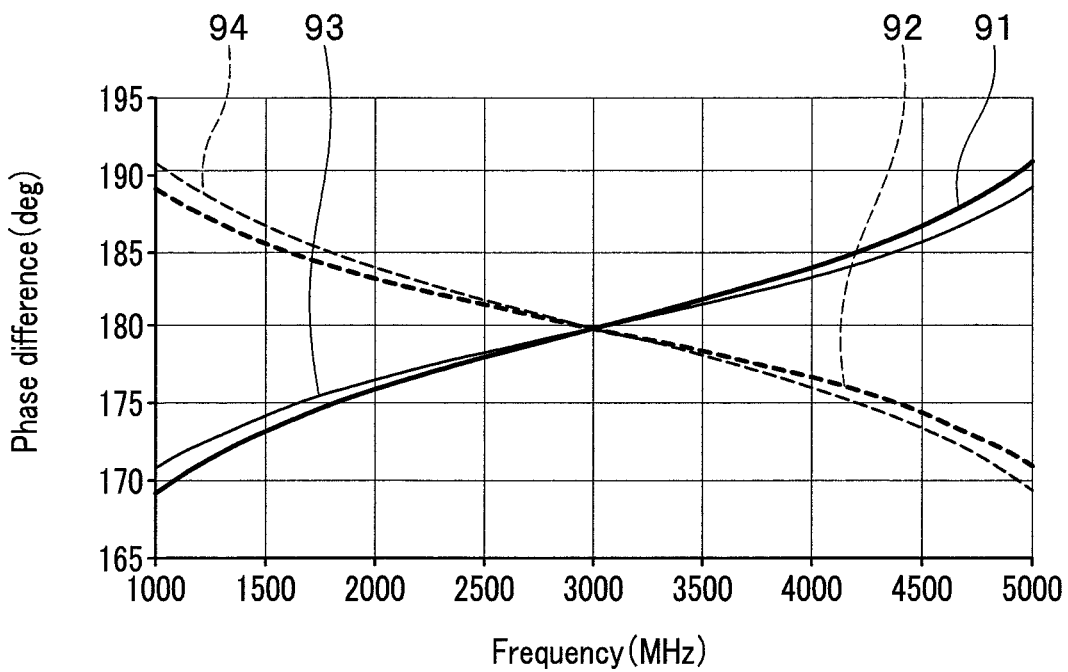
FIG. 23 is a characteristic diagram showing the phase balance characteristics of first to fourth models determined by a simulation.

FIG. 23 shows the phase balance characteristics of the balun 1 of the first to fourth models. Like FIG. 19, FIG. 23 shows the phase balance characteristics of the balun 1 of the first to fourth models in terms of phase difference. In FIG. 23, the reference numeral 91 denotes the phase difference of the first model, the reference numeral 92 the phase difference of the second model, the reference numeral 93 the phase difference of the third model, and the reference numeral 94 the phase difference of the fourth model. With the phase difference denoted as p (deg), the first to fourth models showed little differences in the absolute value of p.

From FIGS. 20 to 24, the first model is found to have the best characteristics over the wide frequency band. In the first model, $Z_{e1}$ is higher than $Z_{e2}$. This means that the distance between the ground conductor layer 501 and the pair of first and third lines 21 and 23 is greater than that between the ground conductor layer 501 and the pair of second and fourth lines 22 and 24. In the first model, $Z_{o1}$ is higher than $Z_{o2}$. This means that the distance between the first and third lines 21 and 23 is greater than that between the second and fourth lines 22 and 24.

In the present embodiment, as defined by the foregoing structural features of the balun 1, the first conductor layers 341, 361, 381, and 401 forming the first and third lines 21 and 23 are located in the first region R1 in the stack 30. The second conductor layers 421, 431, 451, and 461 forming the second and fourth lines 22 and 24 are located in the second region R2 in the stack 30. The ground conductor layer 501 is located at a position different from the first and second regions R1 and R2 in the stacking direction T and closer to the second region R2 than to the first region R1. According to the present embodiment, the distance between the ground conductor layer 501 and the pair of first and third lines 21 and 23 can be thus made larger than that between the ground conductor layer 501 and the pair of second and fourth lines 22 and 24.

In the present embodiment, as defined by the foregoing structural features of the balun 1, the distance between the conductor layers 421 and 431 and the distance between the conductor layers 451 and 461, i.e., the distance D2 is smaller than the distance between the conductor layers 341 and 361 and the distance between the conductor layers 381 and 401, i.e., the distance D1. In other words, the distance D1 is larger than the distance D2. According to the present embodiment, the distance between the first and third lines 21 and 23 can thus be made larger than that between the second and fourth lines 22 and 24.

As described above, according to the present embodiment, the balun 1 is made usable over a wide frequency band by locating the plurality of line-forming conductor layers 341, 361, 381, 401, 421, 431, 451, and 461 and the ground conductor layer 501 to satisfy the foregoing structural features of the balun 1.

Next, other effects of the present embodiment will be described. In the present embodiment, the first capacitor C1 is provided between the first path 15 connecting the unbalanced port 11 and the first line 21 and the ground. In the present embodiment, the second capacitor C2 is provided between the second path 16 connecting the first balanced port 12 and the third line 23 and the ground. According to the present embodiment, impedance matching can be achieved by the first and second capacitors C1 and C2.

FIRST TO THIRD MODIFICATION EXAMPLES

Figure 24:
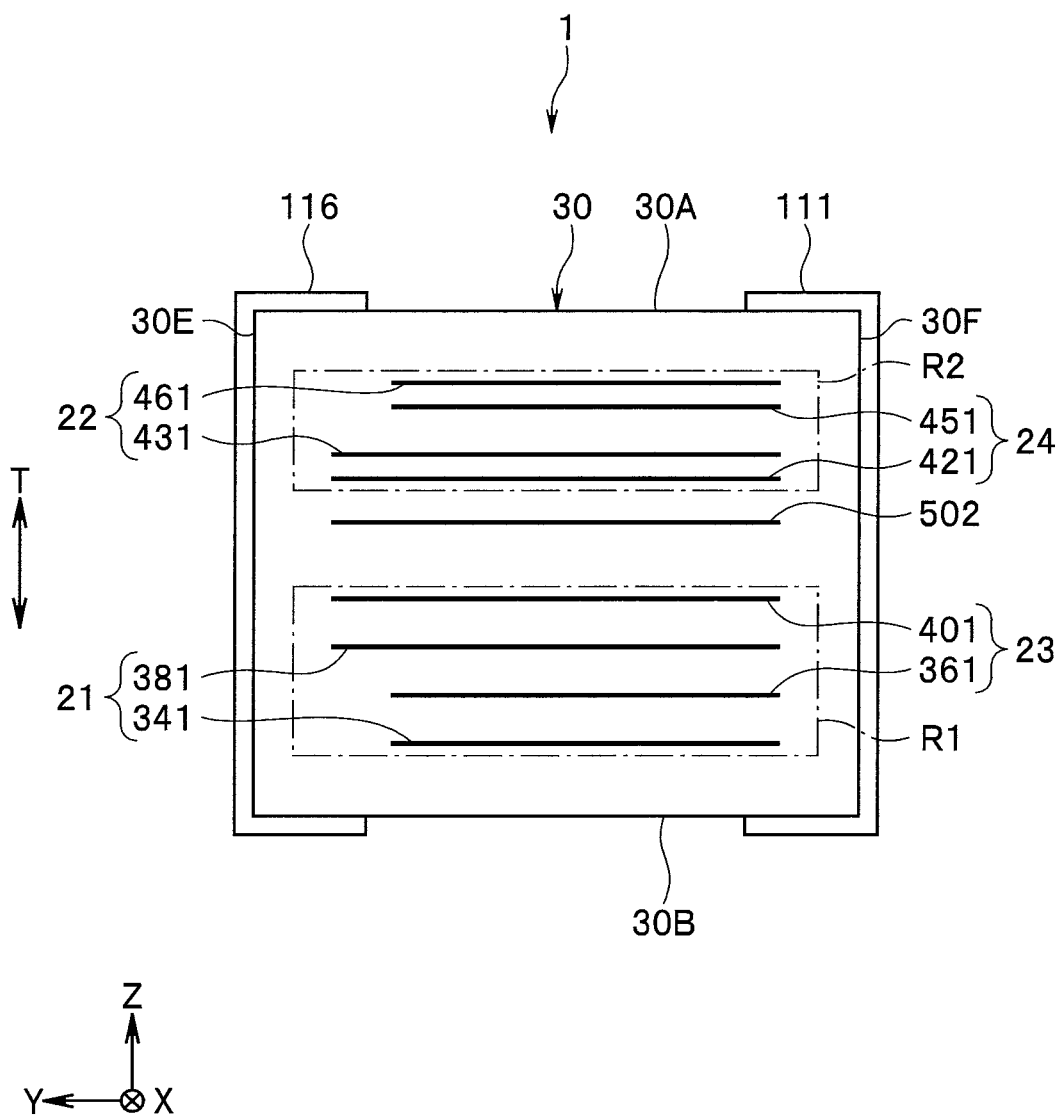
FIG. 24 is a side view of a first modification example of the multilayer balun according to the embodiment of the present invention.

Next, first to third modification examples of the balun 1 according to the present embodiment will be described. The first modification example will first be described with reference to FIG. 24. FIG. 24 is a side view of the first modification example of the balun 1. As shown in FIG. 24, in the first modification example, the plurality of conductor layers constituting the stack 30 of the balun 1 include a ground conductor layer 502 instead of the ground conductor layer 501 shown in FIGS. 4, 5, and 14.

The ground conductor layer 502 is located between the first region R1 and the second region R2 in the stacking direction T. Of the plurality of first conductor layers 341, 361, 381, and 401 located in the first region R1, the conductor layer 401 is the closest to the ground conductor layer 502. Of the plurality of second conductor layers 421, 431, 451, and 461 located in the second region R2, the conductor layer 421 is the closest to the ground conductor layer 502. The distance between the ground conductor layer 502 and the conductor layer 421 is smaller than that between the ground conductor layer 502 and the conductor layer 401. The ground conductor layer 502 has a function of preventing unwanted electromagnetic coupling between the pair of first and third lines 21 and 23 and the pair of second and fourth lines 22 and 24.

Figure 25:
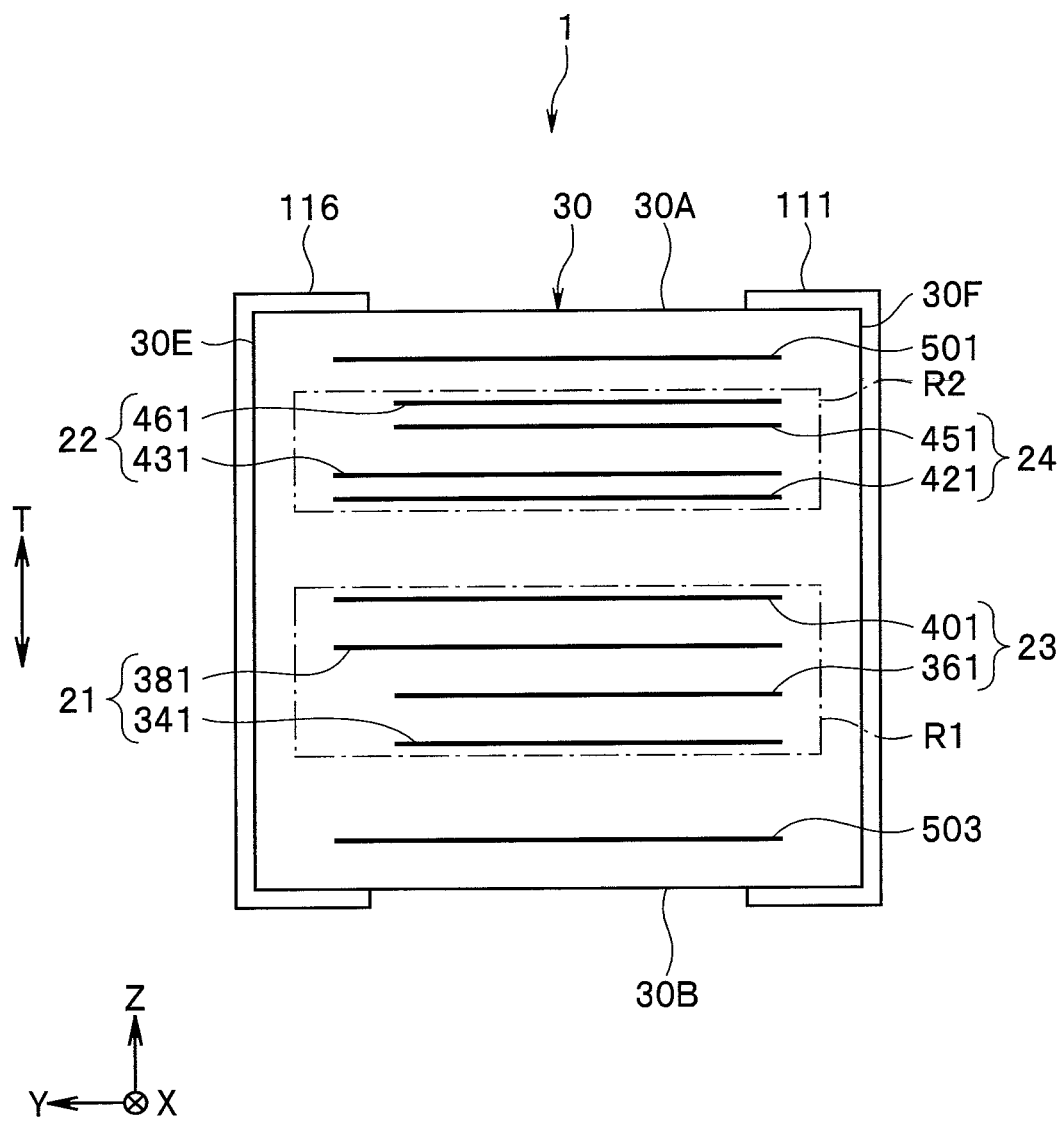
FIG. 25 is a side view of a second modification example of the multilayer balun according to the embodiment of the present invention.

Next, the second modification example will be described with reference to FIG. 25. FIG. 25 is a side view of the second modification example of the balun 1. As shown in FIG. 25, in the second modification example, the plurality of conductor layers constituting the stack 30 of the balun 1 include a ground conductor layer 503 in addition to the ground conductor layer 501 shown in FIGS. 4, 5, and 14.

The ground conductor layer 503 is located between the first region R1 and the bottom surface 30B of the stack 30. Of the plurality of first conductor layers 341, 361, 381, and 401, the conductor layer 341 is the closest to the ground conductor layer 503. Of the plurality of second conductor layers 421, 431, 451, and 461, the conductor layer 461 is the closest to the ground conductor layer 501. The distance between the ground conductor layer 503 and the conductor layer 341 is greater than that between the ground conductor layer 501 and the conductor layer 461.

Figure 26:
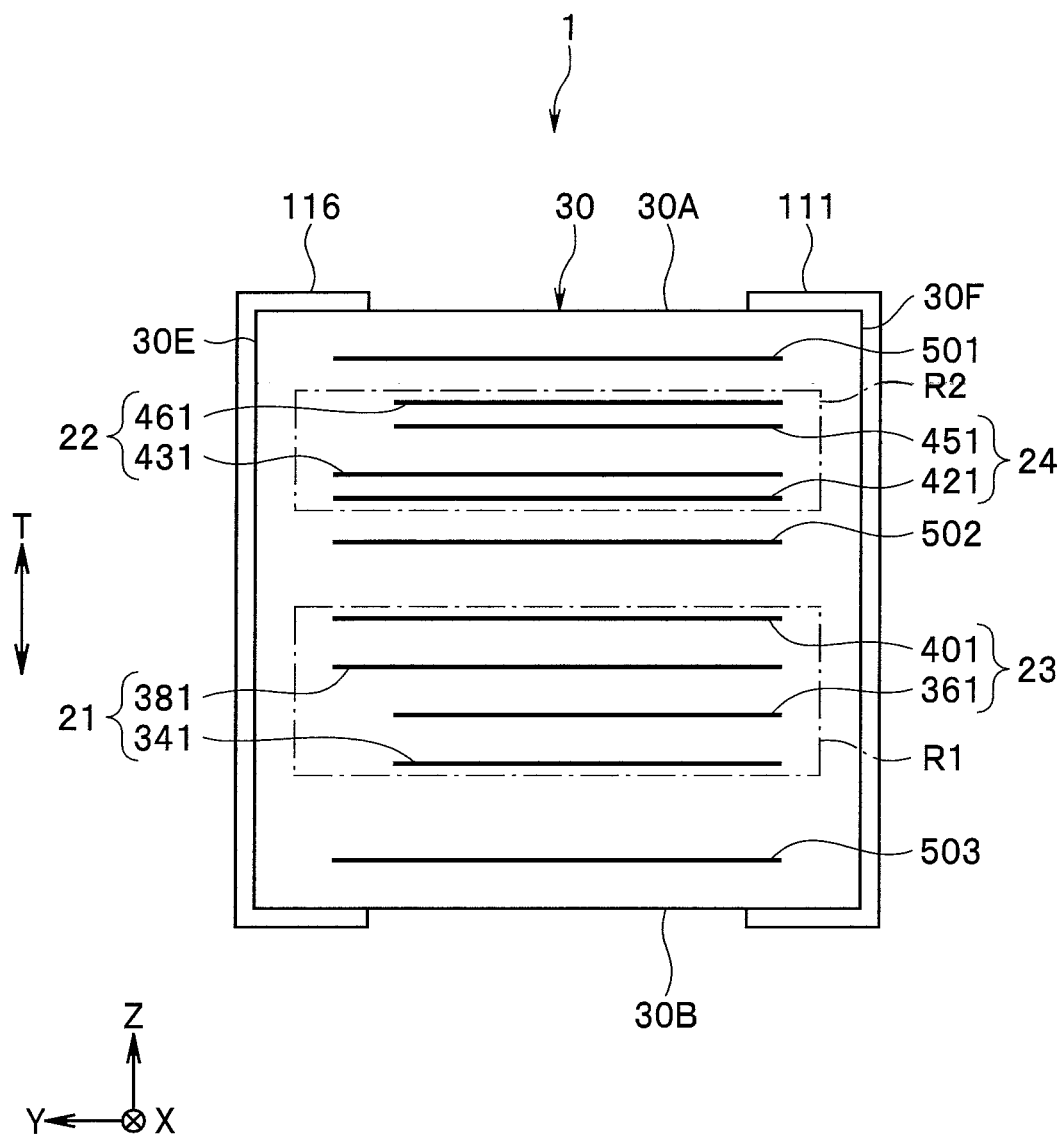
FIG. 26 is a side view of a third modification example of the multilayer balun according to the embodiment of the present invention.

Next, the third modification example will be described with reference to FIG. 26. FIG. 26 is a side view of the third modification example of the balun 1. As shown in FIG. 26, in the third modification example, the plurality of conductor layers constituting the stack 30 of the balun 1 include the ground conductor layer 502 according to the first modification example and the ground conductor layer 503 according to the second modification example in addition to the ground conductor layer 501 shown in FIGS. 4, 5, and 14.

The positional relationship between the ground conductor layer 502 and the line-forming conductor layers 341, 361, 381, 401, 421, 431, 451, and 461 is the same as in the first modification example. The positional relationship between the ground conductor layers 501 and 503 and the line-forming conductor layers 341, 361, 381, 401, 421, 431, 451, and 461 is the same as in the second modification example.

The present invention is not limited to the foregoing embodiment, and various modifications may be made thereto. For example, in the present invention, at least one of the first to fourth lines 21 to 24 may include only one of the plurality of conductor layers constituting the stack 30, or three or more of the conductor layers.

If each of the first to fourth lines 21 to 24 includes a plurality of conductor layers, the distance between the two conductor layers constituting each of the plurality of conductor layer pairs forming the first and third lines 21 and 23 may differ from one conductor layer pair to another. The distance between the two conductor layers constituting each of the plurality of conductor layer pairs forming the second and fourth lines 22 and 24 may differ from one conductor layer pair to another.

The balun according to the present invention may be integrated with a circuit or circuits other than the balun to constitute a multilayer electronic component. Examples of the other circuits include a branch circuit, a filter, and a matching circuit.

Obviously, many modifications and variations of the present invention are possible in the light of the above teachings. Thus, it is to be understood that, within the scope of the appended claims and equivalents thereof, the invention may be practiced in other embodiments than the foregoing most preferable embodiment.

What is claimed is:

1. A multilayer balun comprising:
   an unbalanced port;
   a first balanced port;
   a second balanced port;
   a first line connected to the unbalanced port;
   a second line connected in series to the first line;
   a third line connected to the first balanced port and electromagnetically coupled to the first line;
   a fourth line connected to the second balanced port and electromagnetically coupled to the second line; and
   a stack for integrating the unbalanced port, the first and second balanced ports, and the first to fourth lines, wherein
   the stack includes a plurality of dielectric layers and a plurality of conductor layers stacked on each other,
   the plurality of conductor layers include a plurality of line-forming conductor layers and at least one ground conductor layer connected to a ground,
   the plurality of line-forming conductor layers include a plurality of first conductor layers forming the first and third lines and a plurality of second conductor layers forming the second and fourth lines, and include a plurality of conductor layer pairs each including two conductor layers adjoining in a stacking direction of the plurality of dielectric layers and the plurality of conductor layers, the two conductor layers being electromagnetically coupled to each other,
   the plurality of first conductor layers are located in a first region in the stack,
   the plurality of second conductor layers are located in a second region in the stack, the second region being located at a position different from the first region in the stacking direction,
   the at least one ground conductor layer is located at a position different from the first and second regions in the stacking direction and closer to the second region than to the first region,
   the plurality of second conductor layers include at least one conductor layer pair where a distance between the two conductor layers is smallest among the plurality of conductor layer.pairs, and
   the multilayer balun does not include a conductor layer connected to the ground between the first region and the second region.

2. The multilayer balun according to claim 1, wherein the plurality of first conductor layers include at least one conductor layer pair where the distance between the two conductor layers is largest among the plurality of conductor layer pairs.

3. The multilayer balun according to claim 1, wherein:
   each of the first and third lines includes two or more of the plurality of first conductor layers; and each of the second and fourth lines includes two or more of the plurality of second conductor layers.

4. The multilayer balun according to claim 1, wherein:
the stack includes a top surface and a bottom surface located at opposite ends in the stacking direction; and
the second region is located closer to the top surface of the stack than the first region is.

5. The multilayer balun according to claim 4, wherein the at least one ground conductor layer is located between the second region and the top surface of the stack.

6. The multilayer balun according to claim 1, further comprising:
a first path connecting the unbalanced port and the first line; and
a first capacitor provided between the first path and the ground, wherein
the plurality of conductor layers further include a first capacitor-forming conductor layer forming the first capacitor.

7. The multilayer balun according to claim 1, further comprising:
a second path connecting the first balanced port and the third line; and
a second capacitor provided between the second path and the ground, wherein
the plurality of conductor layers further include a second capacitor-forming conductor layer forming the second capacitor.

8. The multilayer balun according to claim 1, wherein
the stack includes a top surface and a bottom surface located at opposite ends in the stacking direction,
the second region is located closer to the top surface of the stack than the first region is, and
the conductor layer connected to the ground is not provided between the first region and the bottom surface of the stack.

9. A multilayer balun comprising:
an unbalanced port;
a first balanced port;
a second balanced port;
a first line connected to the unbalanced port;
a second line connected in series to the first line;
a third line connected to the first balanced port and electromagnetically coupled to the first line;
a fourth line connected to the second balanced port and electromagnetically coupled to the second line; and
a stack for integrating the unbalanced port, the first and second balanced ports, and the first to fourth lines, wherein
the stack includes a plurality of dielectric layers and a plurality of conductor layers stacked on each other,
the plurality of conductor layers include a plurality of line-forming conductor layers and at least one ground conductor layer connected to a ground,
the plurality of line-forming conductor layers include a plurality of first conductor layers forming the first and third lines and a plurality of second conductor layers forming the second and fourth lines, and include a plurality of conductor layer pairs each including two conductor layers adjoining in a stacking direction of the plurality of dielectric layers and the plurality of conductor layers, the two conductor layers being electromagnetically coupled to each other,
the plurality of first conductor layers are located in a first region in the stack,
the plurality of second conductor layers are located in a second region in the stack, the second region being located at a position different from the first region in the stacking direction,
the at least one ground conductor layer is located at a position different from the first and second regions in the stacking direction and closer to the second region than to the first region,
the plurality of second conductor layers include at least one conductor layer pair where a distance between the two conductor layers is smallest among the plurality of conductor layer pairs,
each of the first and third lines includes two or more of the plurality of first conductor layers; and
each of the second and fourth lines includes two or more of the plurality of second conductor layers.

10. A multilayer balun comprising:
an unbalanced port;
a first balanced port;
a second balanced port;
a first line connected to the unbalanced port;
a second line connected in series to the first line;
a third line connected to the first balanced port and electromagnetically coupled to the first line;
a fourth line connected to the second balanced port and electromagnetically coupled to the second line; and
a stack for integrating the unbalanced port, the first and second balanced ports, and the first to fourth lines, wherein
the stack includes a plurality of dielectric layers and a plurality of conductor layers stacked on each other,
the plurality of conductor layers include a plurality of line-forming conductor layers and at least one ground conductor layer connected to a ground,
the plurality of line-forming conductor layers include a plurality of first conductor layers forming the first and third lines and a plurality of second conductor layers forming the second and fourth lines, and include a plurality of conductor layer pairs each including two conductor layers adjoining in a stacking direction of the plurality of dielectric layers and the plurality of conductor layers, the two conductor layers being electromagnetically coupled to each other,
the plurality of first conductor layers are located in a first region in the stack,
the plurality of second conductor layers are located in a second region in the stack, the second region being located at a position different from the first region in the stacking direction,
the at least one ground conductor layer is located at a position different from the first and second regions in the stacking direction and closer to the second region than to the first region,
the plurality of second conductor layers include at least one conductor layer pair where a distance between the two conductor layers is smallest among the plurality of conductor layer pairs, and
the multilayer balun further comprises:
a first path connecting the unbalanced port and the first line; and
a first capacitor provided between the first path and the ground, wherein
the plurality of conductor layers further include a first capacitor-forming conductor layer forming the first capacitor.

* * * * *